(12) United States Patent
Na et al.

(10) Patent No.: US 12,419,169 B2
(45) Date of Patent: Sep. 16, 2025

(54) DISPLAY DEVICE WITH SECOND INITIALIZATION VOLTAGE LINE FORMING OPENINGS

(71) Applicant: Samsung Display Co., Ltd., Yongin-Si (KR)

(72) Inventors: Ji Su Na, Yongin-si (KR); Won Kyu Kwak, Seongnam-si (KR); Yang Wan Kim, Hwaseong-si (KR); Young Jin Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/750,096

(22) Filed: Jun. 21, 2024

(65) Prior Publication Data

US 2024/0349555 A1 Oct. 17, 2024

Related U.S. Application Data

(63) Continuation of application No. 17/326,245, filed on May 20, 2021, now Pat. No. 12,058,904.

(30) Foreign Application Priority Data

Aug. 5, 2020 (KR) .................. 10-2020-0097931

(51) Int. Cl.
*H10K 59/131* (2023.01)
*H10K 59/35* (2023.01)

(52) U.S. Cl.
CPC ......... *H10K 59/131* (2023.02); *H10K 59/353* (2023.02)

(58) Field of Classification Search
CPC ..................... H10K 59/131; H10K 59/353
See application file for complete search history.

(56) References Cited

U.S. PATENT DOCUMENTS

| 10,211,275 | B2 | 2/2019 | Park et al. |
|---|---|---|---|
| 10,770,533 | B2 | 9/2020 | Park et al. |
| 2003/0160750 | A1 | 8/2003 | Ueda et al. |
| 2010/0038739 | A1* | 2/2010 | Sugio .................. H10F 99/00 257/435 |
| 2012/0105785 | A1 | 5/2012 | Kim et al. |
| 2012/0262435 | A1 | 10/2012 | Park et al. |
| 2014/0132584 | A1 | 5/2014 | Kim |
| 2014/0176399 | A1 | 6/2014 | Lee et al. |

(Continued)

FOREIGN PATENT DOCUMENTS

| CN | 105529351 A | 4/2016 |
|---|---|---|
| CN | 110970469 A | 4/2020 |

(Continued)

*Primary Examiner* — Matthew E. Gordon
*Assistant Examiner* — Sean Ayers Winters
(74) *Attorney, Agent, or Firm* — Innovation Counsel LLP

(57) ABSTRACT

Provided is a display device which comprises a substrate, a plurality of pixels disposed on the substrate, a first initialization voltage line disposed on the substrate along a first direction, and a second initialization voltage line disposed on a different layer from the first initialization voltage line, wherein the second initialization voltage line may include a horizontal portion disposed along the first direction and a vertical portion disposed along a second direction crossing the first direction, and the vertical portion may be disposed between a plurality of pixels adjacent to each other in the first direction.

15 Claims, 17 Drawing Sheets

(56) References Cited

U.S. PATENT DOCUMENTS

| | | | |
|---|---|---|---|
| 2016/0111487 A1 | 4/2016 | Jeong et al. | |
| 2016/0321994 A1* | 11/2016 | Lee | H10K 59/1216 |
| 2017/0194412 A1 | 7/2017 | Park et al. | |
| 2018/0040682 A1* | 2/2018 | Ebisuno | H10K 59/1213 |
| 2020/0005708 A1 | 1/2020 | Hwang et al. | |
| 2020/0066212 A1 | 2/2020 | Kim et al. | |
| 2020/0105849 A1 | 4/2020 | Kim et al. | |
| 2020/0357877 A1* | 11/2020 | Hyun | H10K 59/122 |
| 2021/0028258 A1 | 1/2021 | Lee et al. | |

FOREIGN PATENT DOCUMENTS

| | | |
|---|---|---|
| KR | 10-2016-0046152 A | 4/2016 |
| KR | 10-2017-0028464 A | 3/2017 |
| KR | 10-2017-0081105 A | 7/2017 |
| KR | 10-2020-0023566 A | 3/2020 |
| KR | 10-2020-0037027 A | 4/2020 |
| KR | 10-2021-0049221 A | 5/2021 |

\* cited by examiner

DISPLAY DEVICE WITH SECOND INITIALIZATION VOLTAGE LINE FORMING OPENINGS

CROSS-REFERENCE TO RELATED APPLICATION

This application is a continuation application of U.S. patent application Ser. No. 17/326,245 filed on May 20, 2021, which claims priority to and the benefit of Korean Patent Application No. 10-2020-0097931 filed in the Korean Intellectual Property Office on Aug. 5, 2020, the entire contents of which are incorporated herein by reference.

BACKGROUND

(a) Technical Field

The present disclosure relates to a display device, and more particularly, to a display device that may evenly transmit a second initialization voltage to each area.

(b) Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

The display device may include a plurality of pixels arranged in a row direction and a column direction. Various elements such as a transistor and a capacitor, and various wires capable of supplying a signal to these elements, may be disposed in each pixel.

The display device may include a notch portion mainly formed at an upper end portion thereof. The notch portion is a non-emission area, and a camera, a sensor, etc. may be disposed at the notch portion. Since no pixels are disposed at the notch portion, the number of pixels connected to the wires disposed at respective sides of the notch portion is very small compared to that of other areas. Therefore, a load difference occurs between the wires disposed at respective sides of the notch portion and the wires disposed in other areas, thus a luminance deviation may occur.

In addition, loads of transmitted voltages may be different according to areas of the display device, which may cause a luminance deviation for each area of the display device.

The above information disclosed in this Background section is only for enhancement of understanding of the background of the present disclosure, and therefore it may contain information that does not form the prior art that is already known in this country to a person of ordinary skill in the art.

SUMMARY

The present disclosure provides a display device that may evenly transmit a second initialization voltage.

An embodiment of the present disclosure provides a display device, including: a substrate; a plurality of pixels disposed on the substrate; a first initialization voltage line disposed on the substrate along a first direction; and a second initialization voltage line disposed on a different layer from the first initialization voltage line, wherein the second initialization voltage line may include a horizontal portion disposed along the first direction and a vertical portion disposed along a second direction crossing the first direction, and the vertical portion may be disposed between a plurality of pixels adjacent to each other in the first direction.

One vertical portion may be disposed for every four pixels disposed in the first direction.

One vertical portion may be disposed for every two pixels disposed in the first direction.

One vertical portion may be disposed for every eight pixels disposed in the first direction.

The display device may further include: a connection electrode disposed on the same layer as the second initialization voltage line; and a driving voltage line disposed along the second direction on the second initialization voltage line and the connection electrode, wherein the connection electrode may include a stem portion parallel to the second direction and an extension portion extending from the stem portion in the first direction.

The connection electrode and the driving voltage line may be connected to each other in the extension portion of the connection electrode.

The extension portion of the connection electrode may not be disposed in a pixel in which the vertical portion of the second initialization voltage line is disposed.

Among pixels adjacent in the first direction, in a pixel in which the vertical portion of the second initialization voltage line is not disposed between the pixels, extension portions may be disposed at respective sides of the stem portion of the connection electrode, and each of the extension portions may be connected to the driving voltage line in two pixels adjacent to each other in the first direction.

The display device may further include a polycrystalline semiconductor layer disposed between the substrate and the first initialization voltage line.

A portion of the polycrystalline semiconductor layer may overlap the connection electrode and the second initialization voltage line in a third direction perpendicular to a surface of the substrate.

The display device may further include an oxide semiconductor layer disposed between the polycrystalline semiconductor layer and the second initialization voltage line.

The oxide semiconductor layer may be disposed along the second direction, and the oxide semiconductor layer may not overlap the polycrystalline semiconductor layer in the third direction perpendicular to the surface of the substrate.

The oxide semiconductor layer may not overlap the connection electrode and the second initialization voltage line in the third direction perpendicular to the surface of the substrate.

Another embodiment of the present disclosure provides a display device including: a substrate; a first semiconductor layer disposed on the substrate; a first initialization voltage line disposed along a first direction on the first semiconductor layer; a second semiconductor layer disposed on the first initialization voltage line and disposed along a second direction crossing the first direction; a second initialization voltage line and a connection electrode disposed on the second semiconductor layer; and a driving voltage line disposed on the second initialization voltage line and the connection electrode along the second direction, wherein the second initialization voltage line may include a horizontal portion disposed along the first direction and a vertical portion disposed along the second direction.

The connection electrode may include a stem portion parallel to the second direction and an extension portion extending from the stem portion in the first direction, and the connection electrode may be connected to the driving voltage line in the extension portion.

The stem portion of the connection electrode may be disposed between the extension portion of the connection electrode and the vertical portion of the second initialization voltage line.

The first semiconductor layer may be a polycrystalline semiconductor layer, the second semiconductor layer is an oxide semiconductor layer, and the first semiconductor layer and the second semiconductor layer may not overlap in a third direction perpendicular to a surface of the substrate.

The display device may further include a gate electrode, a first scan line, a light emission control line, and a bypass control line disposed on the same layer as the first initialization voltage line along the first direction, wherein the polycrystalline semiconductor layer overlapping the gate electrode in the third direction perpendicular to the surface of the substrate may form a driving transistor.

An area of the polycrystalline semiconductor layer overlapping the first scan line in the third direction perpendicular to the surface of the substrate may form a second transistor, an area of the polycrystalline semiconductor layer overlapping the light emission control line in the third direction perpendicular to the surface of the substrate may form a fifth transistor and a sixth transistor, and an area of the polycrystalline semiconductor layer overlapping the bypass control line in the third direction perpendicular to the surface of the substrate may form a seventh transistor and an eighth transistor.

The display device may further include an initialization control line and a second scan line disposed along the first direction between the oxide semiconductor layer and the second initialization voltage line, wherein an area of the oxide semiconductor layer overlapping the second scan line in the third direction perpendicular to the surface of the substrate may form a third transistor, and an area of the oxide semiconductor layer overlapping the initialization control line in the third direction perpendicular to the surface of the substrate may form a fourth transistor.

According to the embodiments, it is possible to provide a display device that may evenly transmit a second initialization voltage.

DETAILED DESCRIPTION OF THE EMBODIMENTS

Figure 1:
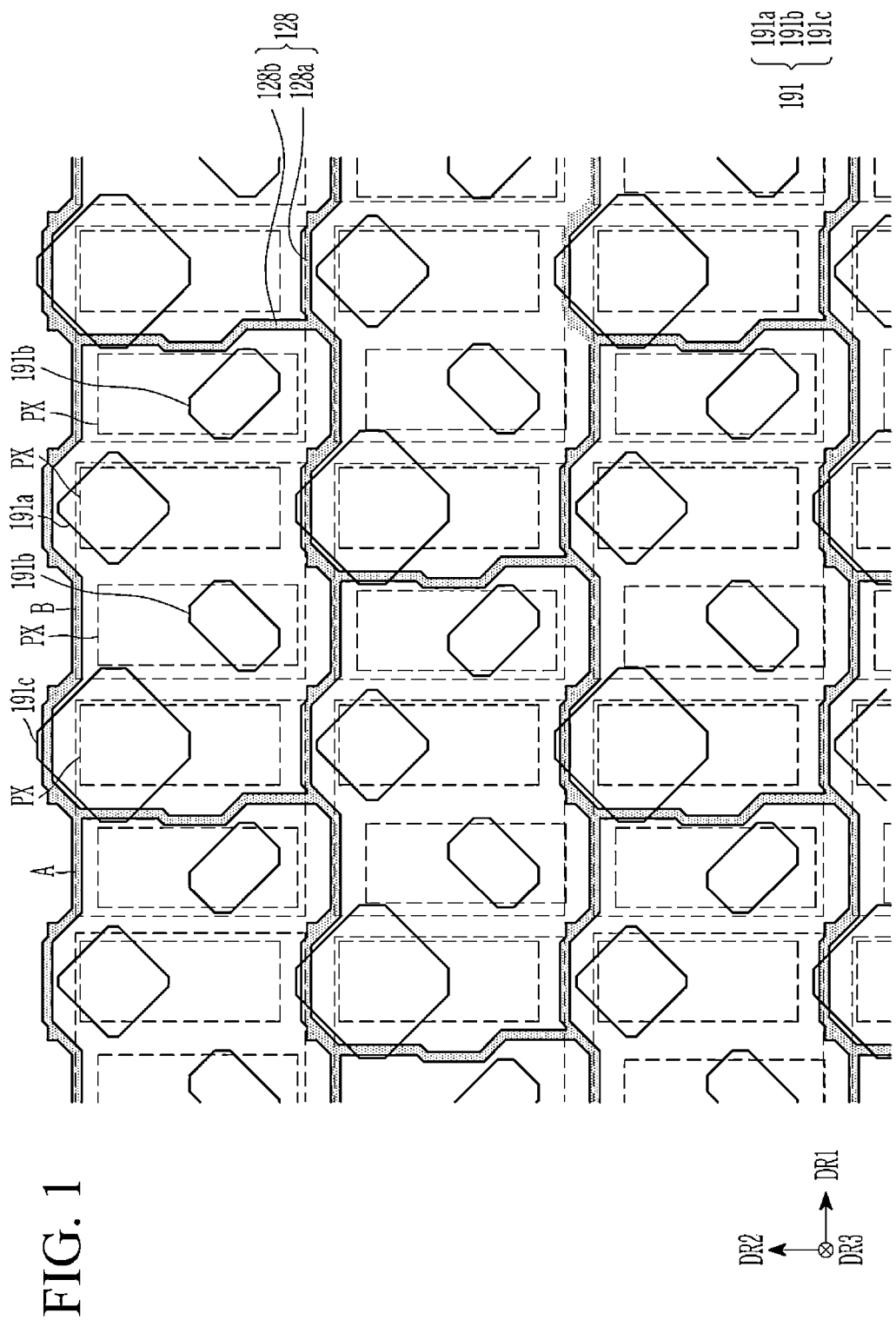
FIG. 1 is a schematic diagram of a display device according to an embodiment of the present disclosure illustrating only a second initialization voltage line and a pixel electrode.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-section" or "on a cross-section" means viewing a cross-section formed by vertically cutting a target portion from the side.

Hereinafter, a display device according to an embodiment of the present disclosure will be described in detail with reference to the accompanying drawings.

FIG. 1 is a schematic diagram of a display device according to an embodiment of the present disclosure illustrating only a second initialization voltage line 128 and a pixel electrode 191. Referring to FIG. 1, the pixel electrode 191 includes a first pixel electrode 191a, a second pixel electrode 191b, and a third pixel electrode 191c. The first pixel electrode 191a may emit red, the second pixel electrode 191b may emit green, and the third pixel electrode 191c may emit blue, but the present disclosure is not limited thereto.

A pixel PX is shown in FIG. 1, and as described later in FIG. 2, one pixel PX includes a plurality of transistors T1, T2, T3, T4, T5, T6, T7, and T8 connected to several signal lines, a storage capacitor Cst, and a light emitting diode LED. Hereinafter, in the present specification, an area corresponding to one pixel PX means an area enclosed by a dotted line in FIG. 2. Referring to FIG. 1, one pixel electrode 191 may be connected to one pixel PX.

Referring to FIG. 1, the second initialization voltage line 128 has a mesh structure including a horizontal portion 128a disposed along a first direction DR1 and a vertical portion 128b disposed along a second direction DR2 crossing the first direction DR1. In this case, the vertical portion 128b may be disposed in an area between respective pixels PX. FIG. 1 illustrates a configuration in which one vertical portion 128b is disposed for every four pixels PX adjacent in the first direction DR1. However, this is only an example, and one vertical portion 128b of the second initialization voltage line 128 may be disposed for every two pixels PX adjacent in the first direction DR1, or it may be disposed for every eight pixels PX adjacent to the first direction DR1.

As described above, since the second initialization voltage line 128 is disposed in the mesh shape including the vertical portion 128b, it is possible to prevent a pinkish display image due to a load difference between second initialization voltage lines 128 for respective areas. That is, when the second initialization voltage line 128 includes only the horizontal portion 128a, a load applied to the notch portion or a lower region of the display device may vary. However, in the display device according to the present embodiment, since the second initialization voltage line 128 is disposed to have the mesh shape including the horizontal portion 128a and the vertical portion 128b, it is possible to minimize a difference between the second initialization voltages VINT2 for respective areas.

FIG. 1 illustrates an area A including the vertical portion 128b of the second initialization voltage line 128 and an area B not including the vertical portion 128b of the second initialization voltage line 128. As will be described later, the area A is an area shown in FIG. 3 below, and the area B is an area shown in FIG. 13 below.

Hereinafter, a specific structure of a display device according to an embodiment of the present disclosure will be described in detail with reference to the accompanying drawings. However, this is merely an example, and the structure of the present disclosure is not limited thereto.

Figure 2:
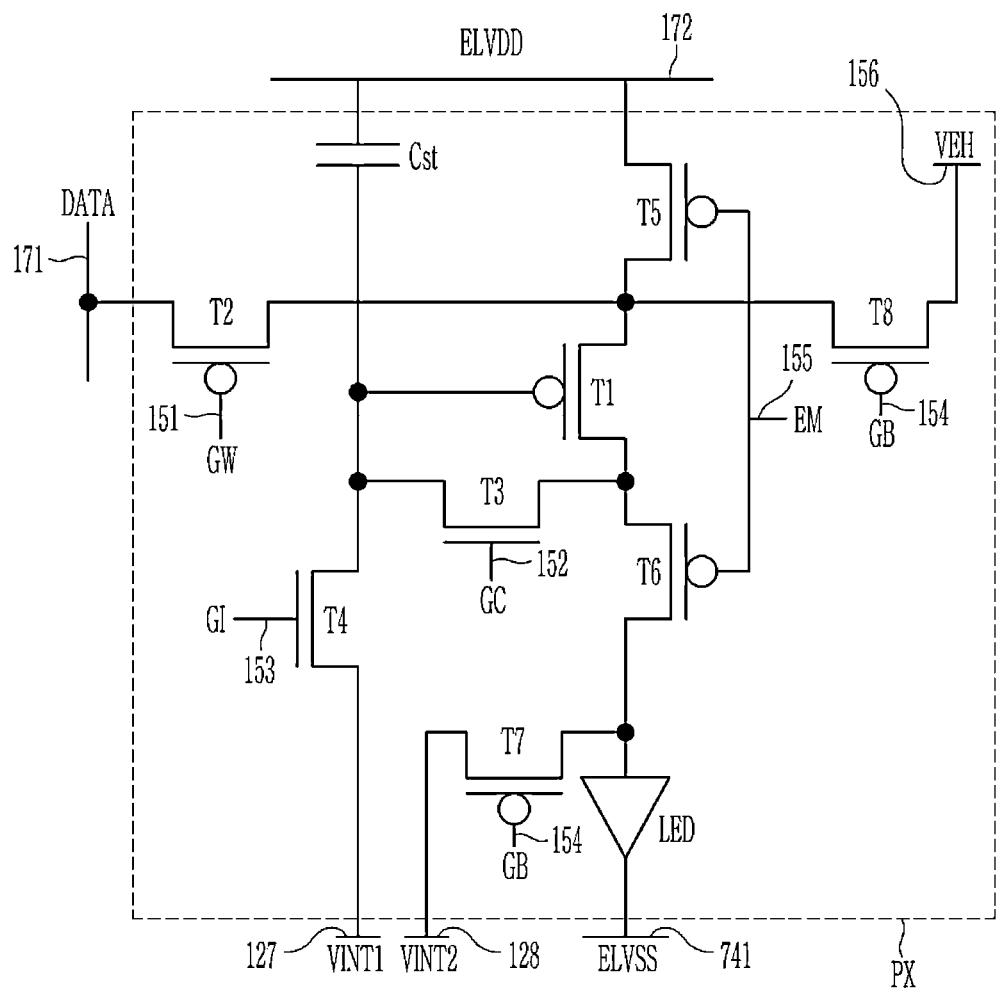
FIG. 2 illustrates a circuit diagram of one pixel of a display device according to an embodiment.

FIG. 2 illustrates a circuit diagram of one pixel of a display device according to an embodiment.

As shown in FIG. 2, one pixel PX of the display device according to the embodiment includes a plurality of transistors T1, T2, T3, T4, T5, T6, T7, and T8 connected to several signal lines, a capacitor Cst, and a light emitting diode LED.

A plurality of signal lines 127, 128, 151, 152, 153, 154, 155, 156, 171, 172, and 741 are connected to one pixel PX. The plurality of signal lines includes a first initialization voltage line 127, a second initialization voltage line 128, a first scan line 151, a second scan line 152, an initialization control line 153, a bypass control line 154, a light emission control line 155, a reference voltage line 156, a data line 171, a driving voltage line 172, and a common voltage line 741.

The first scan line 151 is connected to a gate driving portion (not shown) to transmit a first scan signal GW to the second transistor T2. The second scan line 152 may be applied with a voltage having an opposite polarity to that of a voltage applied to the first scan line 151 at the same timing as the signal of the first scan line 151. For example, when a high voltage is applied to the first scan line 151, a low voltage may be applied to the second scan line 152. The second scan line 152 transmits a second scan signal GC to the third transistor T3.

The initialization control line 153 transmits an initialization control signal GI to the fourth transistor T4. The bypass control line 154 transmits a bypass signal GB to the seventh and eighth transistors T7 and T8. The bypass control line 154 may be formed of the first scan line 151 at a rear end thereof. The light emission control line 155 transmits a light emission control signal EM to the fifth transistor T5 and the sixth transistor T6.

The data line 171 transmits a data voltage DATA generated by a data driving portion (not shown), and luminance at which the light emitting diode LED emits light is changed according to the data voltage DATA applied to the pixel PX.

The driving voltage line 172 applies a driving voltage ELVDD, and the reference voltage line 156 applies a reference voltage VEH. The first initialization voltage line 127 transmits a first initialization voltage VINT1, and the second initialization voltage line 128 transmits a second initialization voltage VINT2. The first initialization voltage VINT1 and the second initialization voltage VINT2 may be different from each other. The common voltage line 741 applies a common voltage ELVSS to a cathode electrode of the light emitting diode LED. In the present embodiment, voltages applied to the driving voltage line 172, the reference voltage line 156, the first and second initialization voltage lines 127 and 128, and the common voltage line 741 may be constant voltages, respectively.

Hereinafter, a structures and a connection relationship of the plurality of transistors will be described in detail.

The driving transistor T1 may have characteristics of a p-type transistor, and may include a polycrystalline semiconductor. The driving transistor T1 may receive the data voltage DATA according to a switching operation of the second transistor T2 to supply a driving current to an anode electrode of the light emitting diode LED. Since brightness of the light emitting diode LED is adjusted according to an amount of a driving current outputted to the anode electrode of the light emitting diode LED, luminance of the light emitting diode LED may be adjusted according to the data voltage DATA applied to the pixel PX. To this end, a first electrode of the driving transistor T1 is disposed to receive the driving voltage ELVDD, and is connected to the driving voltage line 172 via the fifth transistor T5. In addition, the first electrode of the driving transistor T1 is also connected to a second electrode of the second transistor T2 to receive the data voltage DATA. Meanwhile, a second electrode of the driving transistor T1 is disposed to output a current toward the light emitting diode LED, and is connected to the anode of the light emitting diode LED via the sixth transistor T6. In addition, the second electrode of the driving transistor T1 transmits the data voltage DATA applied to the first electrode to the third transistor T3. Meanwhile, a gate electrode of the driving transistor T1 is connected to one electrode (hereinafter also referred to as a second storage electrode) of the storage capacitor Cst. Accordingly, a voltage of the gate electrode of the driving transistor T1 is changed according to a voltage stored in the storage capacitor Cst, such that a driving current outputted from the driving transistor T1 is changed. In addition, the storage capacitor Cst also serves to maintain the voltage of the gate electrode of the driving transistor T1 to be constant during one frame.

The second transistor T2 may have characteristics of a p-type transistor, and may include a polycrystalline semiconductor. The second transistor T2 receives the data voltage DATA into the pixel PX. The gate electrode of the second transistor T2 is connected to the first scan line 151. The first electrode of the second transistor T2 is connected to the data line 171. The second electrode of the second transistor T2 is connected to the first electrode of the driving transistor T1. When the second transistor T2 is turned on by a low voltage of the first scan signal GW transmitted through the first scan line 151, the data voltage DATA transmitted through the data line 171 is transmitted to the first electrode of the driving transistor T1.

The third transistor T3 may have characteristics of an n-type transistor, and may include an oxide semiconductor. The third transistor T3 electrically connects the second electrode of the driving transistor T1 and the gate electrode of the driving transistor T1. As a result, it is a transistor that allows a compensation voltage that is changed by the data voltage DATA passing through the driving transistor T1 to be transmitted to the second storage electrode of the storage capacitor Cst. A gate electrode of the third transistor T3 is connected to the second scan line 152, and a first electrode of the third transistor T3 is connected to the second electrode of the driving transistor T1. A second electrode of the third transistor T3 is connected to the second storage electrode of the storage capacitor Cst and the gate electrode of the driving transistor T1. The third transistor T3 is turned on by a high voltage of the second scan signal GC transmitted through the second scan line 152 to connect the gate electrode of the driving transistor T1 and the second electrode of the driving transistor T1, and it transmits a voltage applied to the gate electrode of the driving transistor T1 to the second storage electrode of the storage capacitor Cst to be stored in the storage capacitor Cst.

The fourth transistor T4 may have characteristics of an n-type transistor, and may include an oxide semiconductor. The fourth transistor T4 initializes the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second storage electrode of the storage capacitor Cst and the gate electrode of the driving transistor T1 via the second electrode of the third transistor T3. The fourth transistor T4 is turned on by a high voltage of the initialization control signal GI transmitted through the initialization control line 153, and at this time, it transmits the first initialization voltage VINT1 to the gate electrode of the driving transistor T1 and the second storage electrode of the storage capacitor Cst. Accordingly, a voltage of the gate electrode of the driving transistor T1 and the storage capacitor Cst is initialized.

The fifth transistor T5 may have characteristics of a p-type transistor, and may include a polycrystalline semiconductor. The fifth transistor T5 transmits the driving voltage ELVDD to the driving transistor T1. A gate electrode of the fifth transistor T5 is connected to the light emission control line 155, a first electrode of the fifth transistor T5 is connected to the driving voltage line 172, and a second electrode of the fifth transistor T5 is connected to the first electrode of the driving transistor T1.

The sixth transistor T6 may have characteristics of a p-type transistor, and may include a polycrystalline semiconductor. The sixth transistor T6 transmits the driving current outputted from the driving transistor T1 to the light emitting diode LED. A gate electrode of the sixth transistor T6 is connected to the light emission control line 155, a first electrode of the sixth transistor T6 is connected to the second electrode of the driving transistor T1, and a second electrode of the sixth transistor T6 is connected to the anode of the light emitting diode LED.

The seventh transistor T7 may have characteristics of a p-type transistor, and may include a polycrystalline semiconductor. The seventh transistor T7 initializes the anode of the light emitting diode LED. A gate electrode of the seventh transistor T7 is connected to the bypass control line 154, a first electrode of the seventh transistor T7 is connected to the anode of the light emitting diode LED, and a second electrode of the seventh transistor T7 is connected to the second initialization voltage line 128. When the seventh transistor T7 is turned on by a low voltage of the bypass signal GB, the second initialization voltage VINT2 is applied to the anode of the light emitting diode LED to be initialized.

The eighth transistor T8 may have characteristics of a p-type transistor, and may include a polycrystalline semiconductor. A gate electrode of the eighth transistor T8 is connected to the bypass control line 154, a first electrode of the eighth transistor T8 is connected to the reference voltage line 156, and a second electrode of the eighth transistor T8 is connected to the first electrode of the driving transistor T1. When the eighth transistor T8 is turned on by a low voltage of the bypass signal GB, the reference voltage VEH is applied to the first electrode of the driving transistor T1.

Referring to FIG. 2, the fourth transistor T4 and the seventh transistor T7 are not connected to the same initialization voltage line, but are connected to different initialization voltage lines. That is, the fourth transistor T4 may be connected to the first initialization voltage line 127 to receive the first initialization voltage VINT1, and the seventh transistor T7 may be connected to the second initialization voltage line 128 to receive the second initialization voltage VINT2. When the fourth transistor T4 and the seventh transistor T7 are connected to the same initialization voltage line, the same initialization voltage must be applied to the fourth transistor T4 and the seventh transistor T7.

The light emitting display device may be driven by changing a frequency in some cases. For example, the frequency may be changed from 120 Hz to 60 Hz, from 120 Hz to 30 Hz, or from 120 Hz to 1 Hz, etc. As such, when it is driven by changing the frequency, a deviation may occur in characteristics of a variable refresh rate (VRR). Particularly, a larger deviation may occur in an area displaying a low gray. However, in the present embodiment, different initialization voltages may be applied to the fourth transistor T4 and the seventh transistor T7. Therefore, by allowing the first initialization voltage VINT1 applied to the fourth transistor T4 to be different from the second initialization voltage VINT2 applied to the seventh transistor T7, it is possible to reduce the deviation in the characteristic of the variable refresh rate at a low gray.

In the above, it has been described that one pixel includes eight transistors T1, T2, T3, T4, T5, T6, T7, and T8 and one storage capacitor Cst, but the present disclosure is not limited thereto, and the number of transistors, the number of capacitors, and their connection relationships may be variously changed.

In the present embodiment, the driving transistor T1 may include a polycrystalline semiconductor. In addition, the third transistor T3 and the fourth transistor T4 may include an oxide semiconductor. The second transistor T2, the fifth transistor T5, the sixth transistor T6, the seventh transistor T7, and the eighth transistor T8 may include a polycrystalline semiconductor. However, the present disclosure is not limited thereto, and at least one of the second transistor T2, the fifth transistor T5, the sixth transistor T6, the seventh transistor T7, and the eighth transistor T8 may include an oxide semiconductor. In the present embodiment, by allowing the third transistor T3 and the fourth transistor T4 to include a different semiconductor material from that of the driving transistor T1, they may be more stably driven, and thus it is possible to improve reliability.

Hereinafter, planar and cross-sectional structures of the display device according to the embodiment will be further described with reference to FIGS. 3, 4, 5, 6, 7, 8, 9, 10, 11, and 12.

Figure 3:
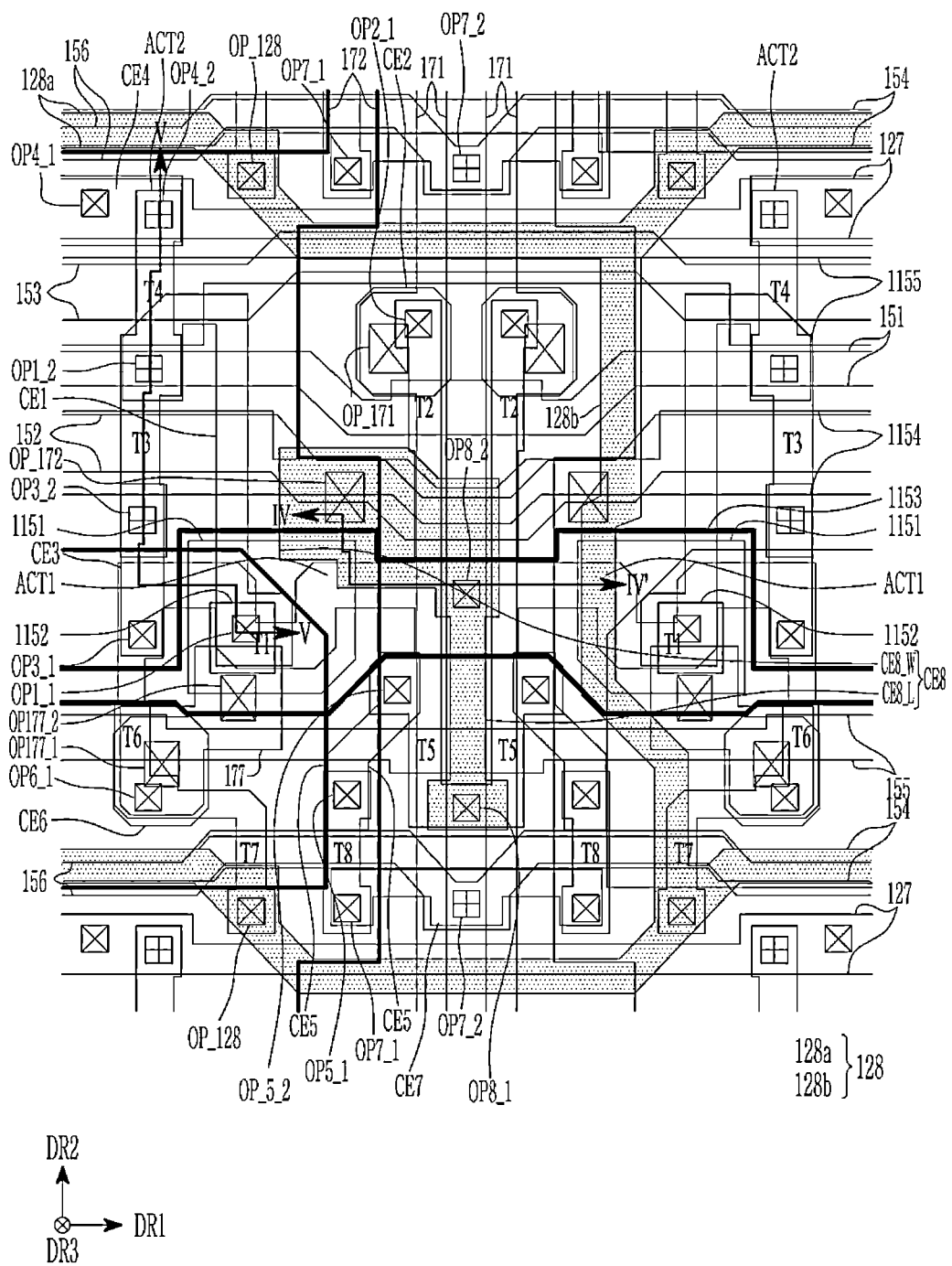
FIG. 3 illustrates a top plan view of a display device according to an embodiment.
Figure 4:
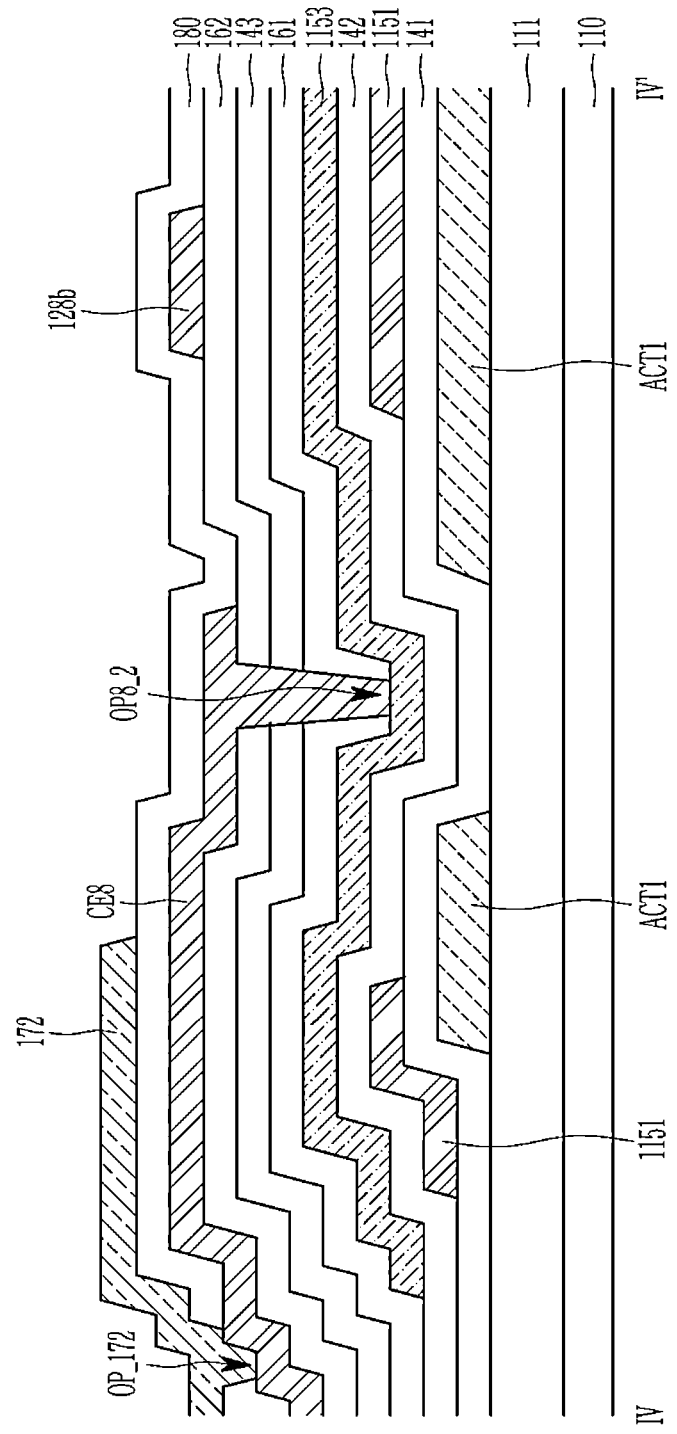
FIG. 4 illustrates a cross-sectional view taken along line IV-IV' of FIG. 3.
Figure 5:
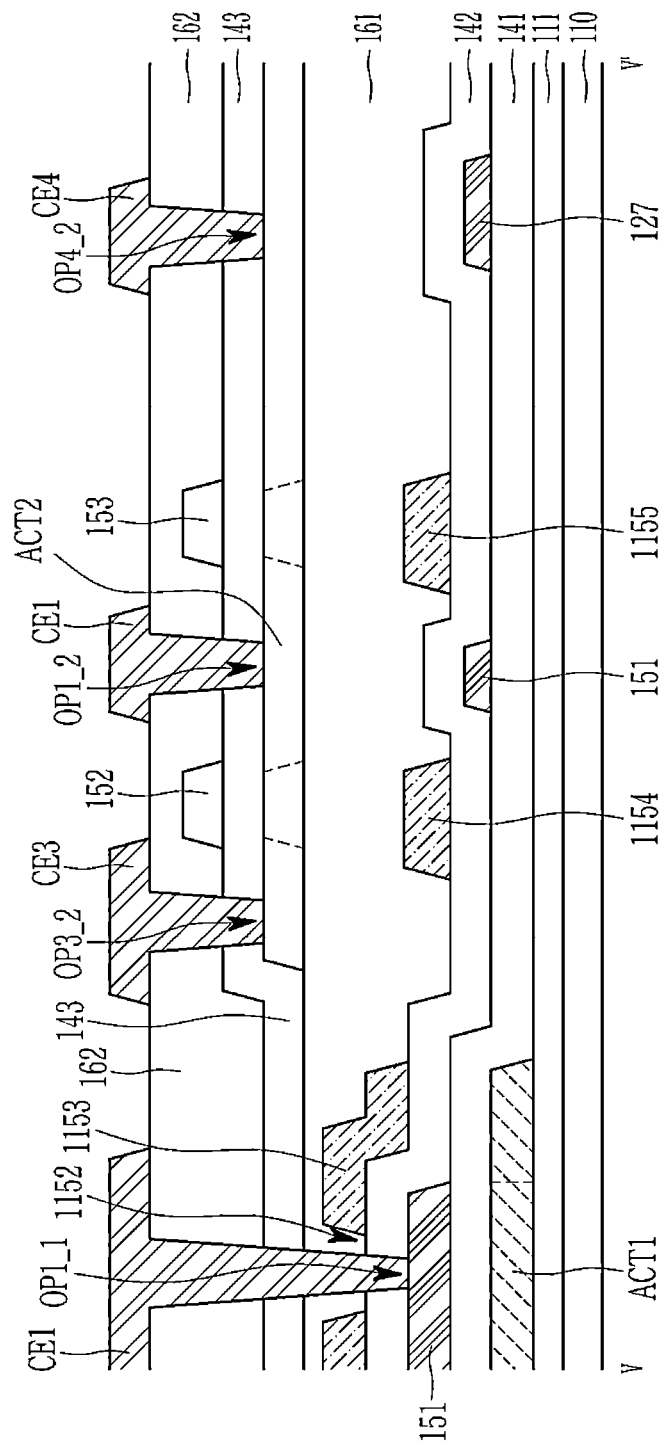
FIG. 5 illustrates a cross-sectional view taken along line V-V' of FIG. 3.

FIG. 3 illustrates a top plan view of a display device according to an embodiment, FIG. 4 illustrates a cross-sectional view taken along line IV-IV' of FIG. 3, FIG. 5 illustrates a cross-sectional view taken along line V-V' of FIG. 3, and FIGS. 6, 7, 8, 9, 10, 11, and 12 illustrate sequential top plan views of a manufacturing order of a display device according to an embodiment. FIGS. 6, 7, 8, 9, 10, 11, and 12 illustrate two adjacent pixels, and the two pixels may have a symmetrical shape. Hereinafter, a pixel disposed at a left side will be mainly described.

A polycrystalline semiconductor layer ACT1 may be disposed on a substrate 110 as shown in FIGS. 3, 4, 5, 6, 7, 8, 9, 10, 11, and 12. The polycrystalline semiconductor layer ACT1 may include a polycrystalline semiconductor material.

Figure 6:
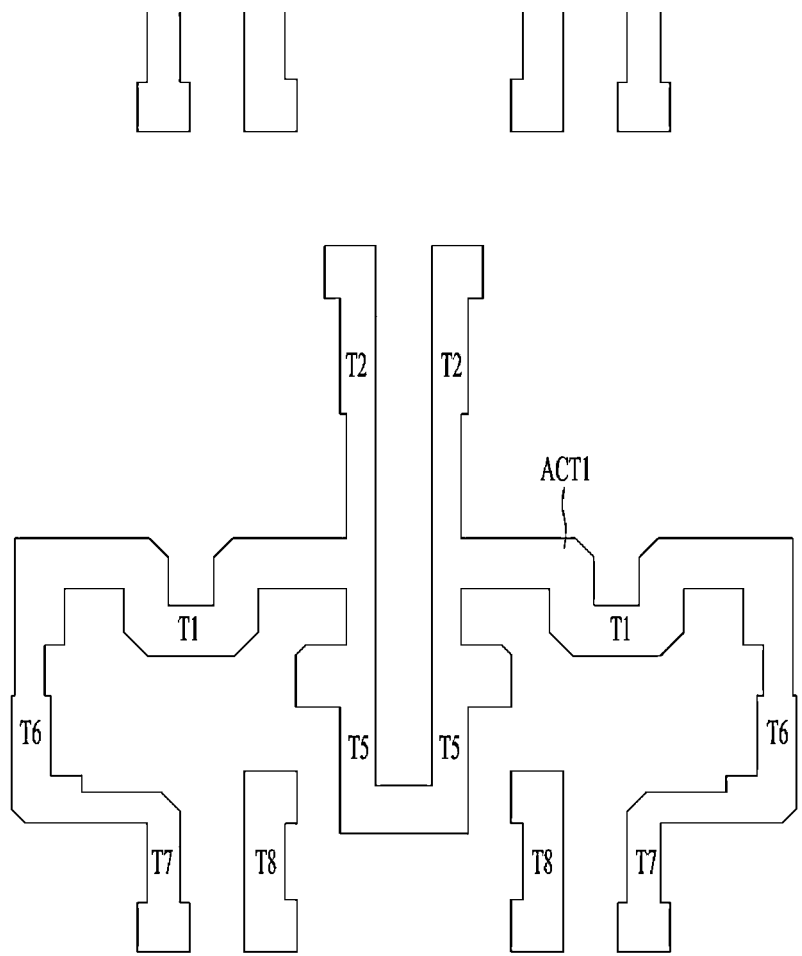
FIGS. 6, 7, 8, 9, 10, 11, and 12 illustrate sequential top plan views of a manufacturing order of a display device according to an embodiment.

FIG. 6 illustrates the polycrystalline semiconductor layer ACT1. The polycrystalline semiconductor layer ACT1 may include a channel, a first electrode, and a second electrode of each of the driving transistor T1, the second transistor T2, the fifth transistor T5, the sixth transistor T6, the seventh transistor T7, and the eighth transistor T8. In FIGS. 3, 4, 5, 6, 7, 8, 9, 10, 11, and 12, each transistor is indicated, and the channel of each transistor may be disposed in a center region of the transistor, while the first electrode and the second electrode of each transistor may be disposed in respective regions of the channel.

The channel of the driving transistor T1 may have a curved shape in a plan view. However, the shape of the channel of the driving transistor T1 is not limited thereto, and may be variously changed. For example, the channel of the driving transistor T1 may be bent in a different shape or may be formed in a rod shape.

Referring to FIG. 4 and FIG. 5, a buffer layer 111 may be disposed between the substrate 110 and the polycrystalline semiconductor layer ACT1. The buffer layer 111 may have a structure of a single layer or a multilayer. The buffer layer 111 may include an organic insulating material or an inorganic insulating material. The buffer layer 111 may include a silicon nitride or a silicon oxide. The buffer layer 111 may be omitted in some embodiments.

Referring to FIG. 4 and FIG. 5, a first gate insulating film 141 may be disposed on the polycrystalline semiconductor layer ACT1. The first gate insulating film 141 may include a silicon nitride, a silicon oxide, or the like.

Figure 7:
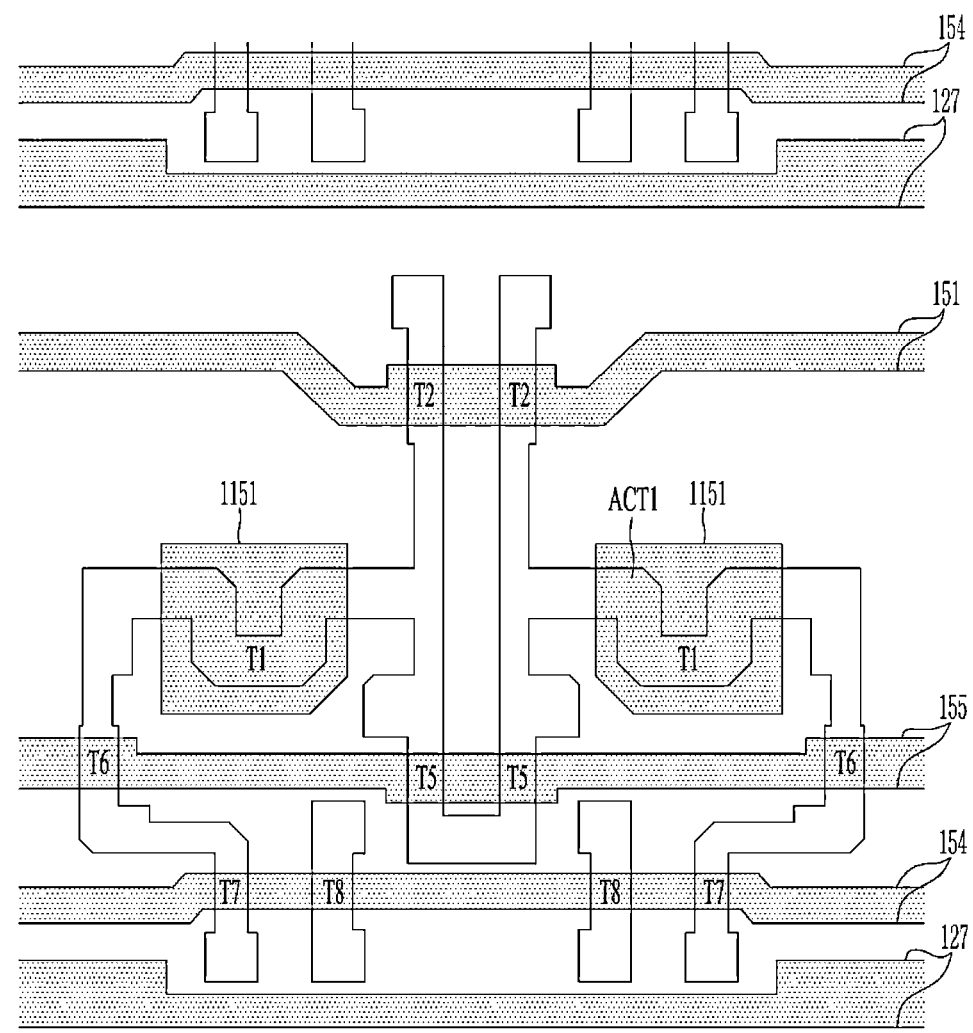
Figure 7:

A first gate conductive layer GE1 may be disposed on the first gate insulating film 141. FIG. 7 illustrates the polycrystalline semiconductor layer ACT1 and the first gate conductive layer GE1 together. The first gate conductive layer GE1 may further include a gate electrode 1151 of the driving transistor T1, the first initialization voltage line 127, the first scan line 151, the light emission control line 155, and the bypass control line 154.

The first initialization voltage line 127, the first scan line 151, the light emission control line 155, and the bypass control line 154 may be disposed along the first direction DR1.

A portion of the first scan line 151 may be a gate electrode of the second transistor T2. The gate electrode of the fifth transistor T5 and the gate electrode of the sixth transistor T6 may be a portion of the light emission control line 155. The gate electrode of the seventh transistor T7 and the gate electrode of the eighth transistor T8 may be a portion of the bypass control line 154.

After the first gate conductive layer GE1 including the gate electrode 1151 of the driving transistor T1 is formed, a doping process may be performed. The polycrystalline semiconductor layer ACT1 covered by the first gate conductive layer GE1 is not doped, and a portion of the polycrystalline semiconductor layer ACT1 not covered by the first gate conductive layer GE1 may be doped to have the same characteristic as that of a conductor. In this case, a doping process may be performed with a p-type dopant, and the driving transistor T1 including the polycrystalline semiconductor ACT1, the second transistor T2, the fifth transistor T5, the sixth transistor T6, the seventh transistor T7, and the eighth transistor T8 may have characteristic of a p-type transistor.

Referring to FIG. 5 simultaneously, the polycrystalline semiconductor layer ACT1 that does not overlap the gate electrode 1151 by doping and may have conductivity, and an area overlapping the gate electrode 1151 in a third direction DR3 perpendicular to the substrate 110 may be a channel of the driving transistor T1.

Alternatively, a plasma process may be performed instead of the doping process. The polycrystalline semiconductor layer ACT1 may be made conductive by a plasma process.

Referring to FIG. 4, FIG. 5, and FIG. 7 simultaneously, a second gate insulating film 142 may be disposed on the first gate conductive layer GE1 including the gate electrode 1151 and on the first gate insulating film 141. The second gate insulating film 142 may include a silicon nitride, a silicon oxide, or the like.

A second gate conductive layer GE2 may be disposed on the second gate insulating film 142.

Figure 8:
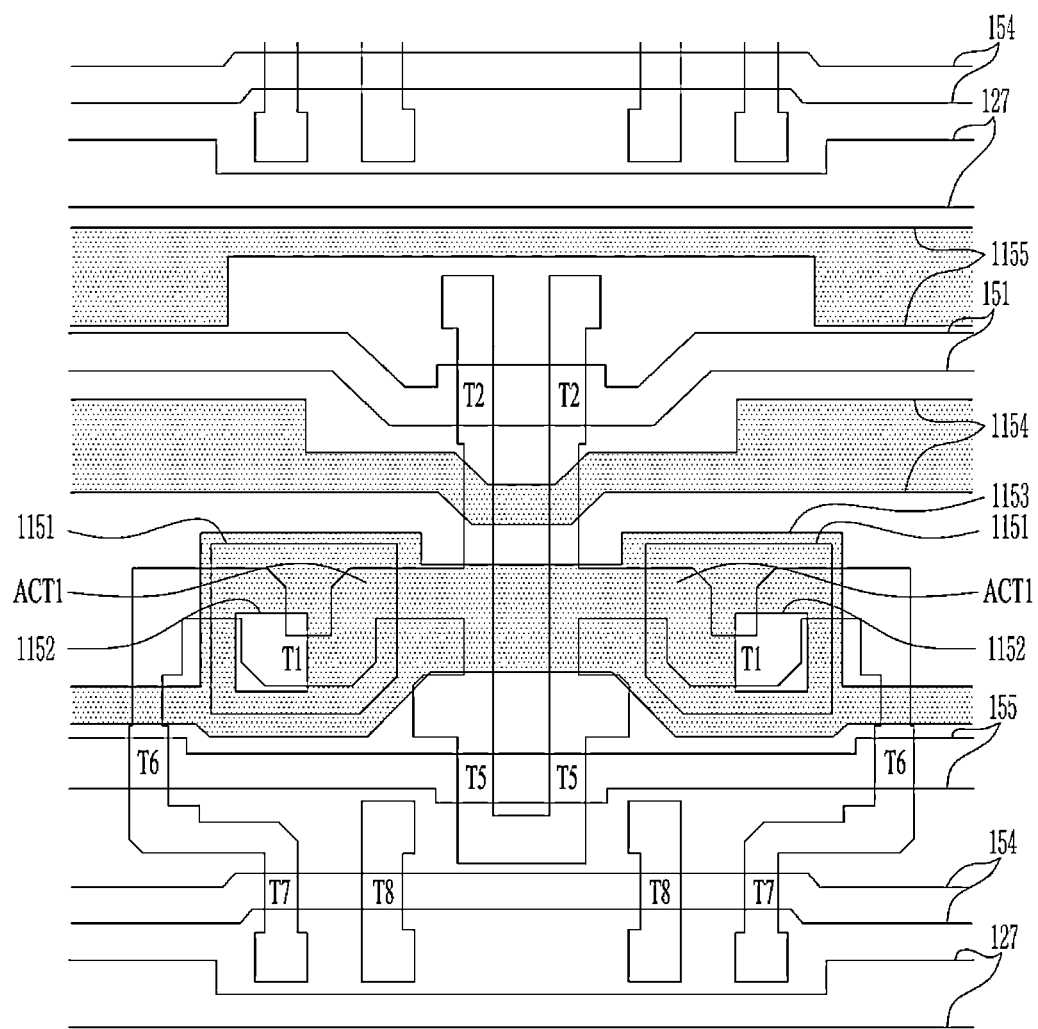

FIG. 8 illustrates the polycrystalline semiconductor layer ACT1, the first gate conductive layer GE1, and the second gate conductive layer GE2 together.

The second gate conductive layer GE2 may include a first storage electrode 1153 of the storage capacitor Cst, a first overlapping wire 1154, and a second overlapping wire 1155.

The first overlapping wire 1154 and the second overlapping wire 1155 may be disposed along the first direction DR1. Referring to FIG. 3, the first overlapping wire 1154 then overlaps the second scan line 152 in the third direction DR3 perpendicular to a surface of the substrate 110, and the second overlapping wire 1155 overlaps the initialization control line 153 in the third direction DR3 perpendicular to the surface of the substrate 110.

The first storage electrode 1153 overlaps the gate electrode 1151 of the driving transistor T1 to form the storage capacitor Cst. An opening 1152 may be formed in the first storage electrode 1153 of the storage capacitor Cst. The opening 1152 of the first storage electrode 1153 of the storage capacitor Cst may overlap the gate electrode 1151 of the driving transistor T1. The first storage electrodes 1153 may be connected to each other along the first direction DR1.

Referring to FIG. 4, FIG. 5, and FIG. 8 simultaneously, a first interlayer insulating film 161 may be disposed on the second gate conductive layer GE2 including the first storage electrode 1153. The first interlayer insulating film 161 may include a silicon nitride, a silicon oxide, or the like.

An oxide semiconductor layer ACT2 may be disposed on the first interlayer insulating film 161. The oxide semiconductor layer ACT2 may include at least one of a primary metal oxide such as an indium (In) oxide, a tin (Sn) oxide, or a zinc (Zn) oxide; a binary metal oxide such as an In—Zn based oxide, a Sn—Zn based oxide, an Al—Zn based oxide, a Zn—Mg based oxide, a Sn—Mg based oxide, an In—Mg based oxide, or an In—Ga based oxide, a ternary metal oxides such as an In—Ga—Zn based oxide, an In—Al—Zn based oxide, an In—Sn—Zn based oxide, a Sn—Ga—Zn based oxide, an Al—Ga—Zn based oxide, a Sn—Al—Zn based oxide, an In—Hf—Zn based oxide, an In—La—Zn based oxide, an In—Ce—Zn based oxide, an In—Pr—Zn based oxide, an In—Nd—Zn based oxide, an In—Sm—Zn based oxide, an In—Eu—Zn based oxide, an In—Gd—Zn based oxide, an In—Tb—Zn based oxide, an In—Dy—Zn based oxide, an In—Ho—Zn based oxide, an In—Er—Zn based oxide, an In—Tm—Zn, an In—Yb—Zn based oxide, or an In—Lu—Zn based oxide; and a quaternary metal oxide such as an In—Sn—Ga—Zn based oxide, an In—Hf—Ga—Zn based oxide, an In—Al—Ga—Zn based oxide, an In—Sn—Al—Zn based oxide, an In—Sn—Hf—Zn based oxide, or an In—Hf—Al—Zn based oxide. For example, the oxide semiconductor layer ACT2 may include an indium-gallium-zinc oxide (IGZO) among the In—Ga—Zn based oxide.

Figure 9:
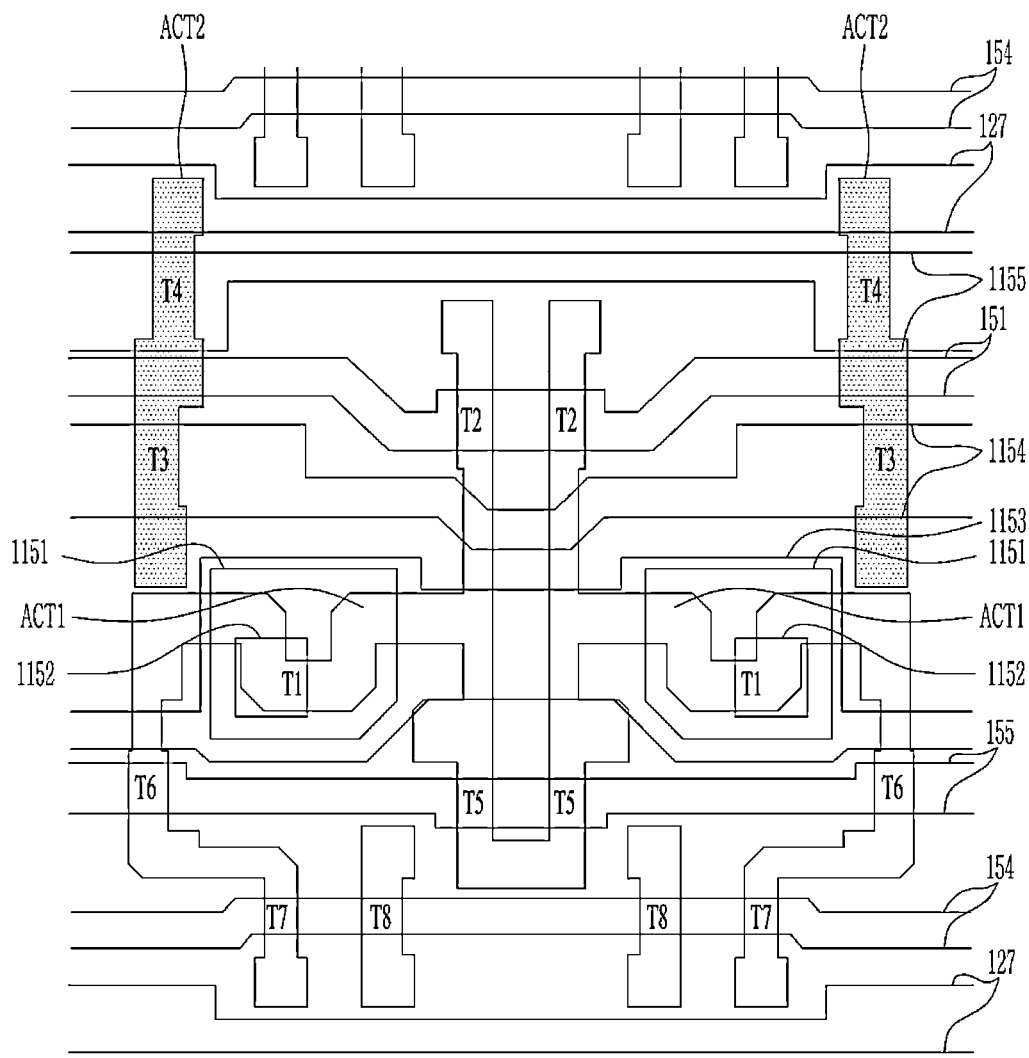

FIG. 9 illustrates the polycrystalline semiconductor layer ACT1, the first gate conductive layer GE1, the second gate conductive layer GE2, and the oxide semiconductor layer ACT2 together.

The oxide semiconductor layer ACT2 may include the channel, the first electrode, and the second electrode of the third transistor T3, and the channel, the first electrode, and the second electrode of the fourth transistor T4.

Referring to FIG. 4 and FIG. 5, a third gate insulating film 143 may be disposed on the oxide semiconductor layer ACT2. The third gate insulating film 143 may include a silicon nitride, a silicon oxide, or the like.

A third gate conductive layer GE3 may be disposed on the third gate insulating film 143.

Figure 10:
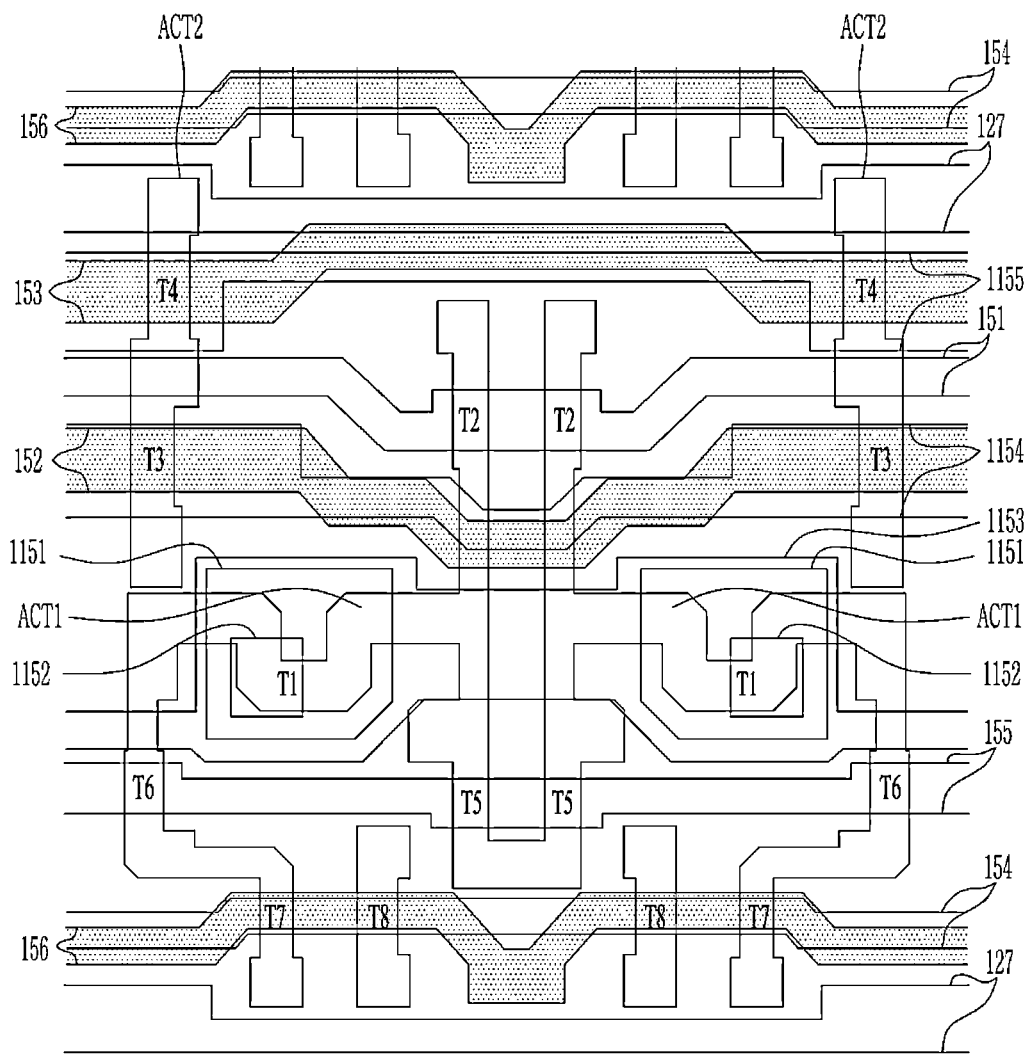

FIG. 10 illustrates the polycrystalline semiconductor layer ACT1, the first gate conductive layer GE1, the second gate conductive layer GE2, the oxide semiconductor layer ACT2, and the third gate conductive layer GE3 together.

The third gate conductive layer GE3 may include the initialization control line 153, the second scan line 152, and the reference voltage line 156. The initialization control line 153, the second scan line 152, and the reference voltage line 156 may be disposed along the first direction DR1. Referring to FIG. 5 simultaneously, a portion of the initialization control line 153 may be a gate electrode of the fourth transistor T4. A portion of the second scan line 152 may be a gate electrode of the third transistor T3. The reference voltage line 156 may be connected to the first electrode of the eighth transistor T8.

After the third gate conductive layer GE3 is formed, a doping process may be performed. A portion of the oxide semiconductor layer ACT2 that is covered by the third gate conductive layer GE3 may not be doped, and a portion of the oxide semiconductor layer ACT2 that is not covered by the third gate conductive layer GE3 may be doped to have the same characteristics as a conductor. Referring to FIG. 5 simultaneously, the channel of the third transistor T3 may be disposed under the gate electrode so as to overlap the second scan line 152 as the gate electrode in the third direction DR3 perpendicular to the substrate 110, and the first electrode and the second electrode of the third transistor T3 may not overlap the gate electrode.

Referring to FIG. 5 simultaneously, the channel of the fourth transistor T4 may be disposed under the gate electrode so as to overlap the initialization control line 153 as the gate electrode in the third direction DR3 perpendicular to the substrate 110. The first electrode and the second electrode of the fourth transistor T4 may not overlap the gate electrode. The doping process of the oxide semiconductor layer ACT2 may be performed with an n-type dopant, and the third transistor T3 and the fourth transistor T4 including the oxide semiconductor layer ACT2 may have characteristics of an n-type transistor.

Referring to FIG. 4, FIG. 5, and FIG. 10 simultaneously, a second interlayer insulating film 162 may be disposed on the third gate conductive layer GE3.

Figure 11:
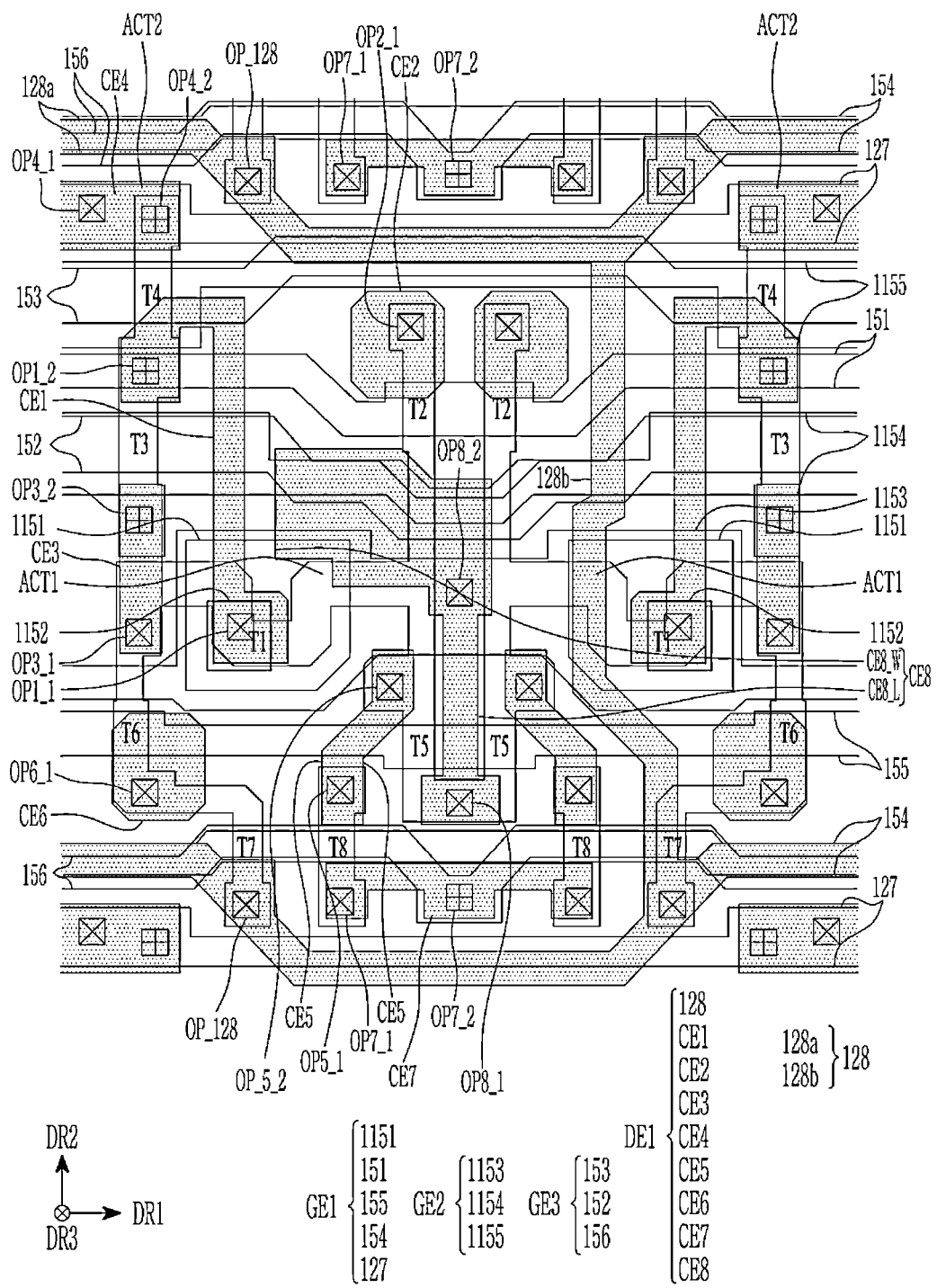

A first data conductive layer DE1 may be disposed on the second interlayer insulating film 162. FIG. 11 illustrates the polycrystalline semiconductor layer ACT1, the first gate conductive layer GE1, the second gate conductive layer GE2, the oxide semiconductor layer ACT2, the third gate conductive layer GE3, and the first data conductive layer DE1 together.

The first data conductive layer DE1 may include the second initialization voltage line 128, a first connection electrode CE1, a second connection electrode CE2, a third connection electrode CE3, a fourth connection electrode CE4, a fifth connection electrode CE5, a sixth connection electrode CE6, a seventh connection electrode CE7, and an eighth connection electrode CE8.

The second initialization voltage line 128 includes a horizontal portion 128a disposed along the first direction DR1 and a vertical portion 128b disposed along the second direction DR2.

The second initialization voltage line 128 may be connected to the polycrystalline semiconductor layer ACT1 through an initialization voltage opening OP_128. An initialization voltage is transmitted to the polycrystalline semiconductor layer ACT1 through this opening.

The horizontal portion of the second initialization voltage line 128 may be alternately overlapped with the reference voltage line 156 and the first initialization voltage line 127 in the third direction DR3 perpendicular to the substrate 110. The vertical portion 128b of the second initialization voltage line 128 will be described later, but may be disposed along the second direction DR2 in an area in which the eighth connection electrode CE8 is not disposed.

Referring to FIG. 5 simultaneously, the first connection electrode CE1 may be connected to the gate electrode 1151 of the driving transistor T1 through a (1-1)-th opening OP1_1, and may be connected to the oxide semiconductor layer ACT2 through a (1-2)-th opening OP1_2.

The second connection electrode CE2 may be connected to the polycrystalline semiconductor layer ACT1 through a (2-1)-th opening OP2_1.

Still referring to FIG. 5 simultaneously, the third connection electrode CE3 may be connected to the polycrystalline semiconductor layer ACT1 through a (3-1)-th opening OP3_1, and may be connected to the oxide semiconductor layer ACT2 through a (3-2)-th opening OP3_2.

Still referring to FIG. 5 simultaneously, the fourth connection electrode CE4 may be connected to the first initialization voltage line 127 through a (4-1)-th opening OP4_1, and the fourth connection electrode CE4 may be connected to the oxide semiconductor layer ACT2 through a (4-2)-th opening OP4_2.

The fifth connection electrode CE5 is connected to the polycrystalline semiconductor layer ACT1 through a (5-1)-th opening OP5_1 and a (5-2)-th opening OP5_2.

The sixth connection electrode CE6 may be connected to the polycrystalline semiconductor layer ACT1 through a (6-1)-th opening OP6_1.

The seventh connection electrode CE7 may be connected to the polycrystalline semiconductor layer ACT1 through a (7-1)-th opening OP7_1, and may be connected to the reference voltage line 156 through a (7-2)-th opening OP7_2.

The eighth connection electrode CE8 may be connected to the polycrystalline semiconductor layer ACT1 through an (8-1)-th opening OP8_1. In addition, it may be connected to the first storage electrode 1153 through an (8-2)-th opening OP8_2. Although described later, referring to FIG. 3 and FIG. 4 simultaneously, the eighth connection electrode may receive the ELVDD voltage from the driving voltage line 172 through a driving opening OP_172. The eighth connection electrode CE8 may transmit the ELVDD voltage transmitted in the second direction DR2 to the first direction DR1. Referring to FIG. 3, the eighth connection electrode CE8 may be connected to the driving voltage line 172 only in one of two adjacent pixels, and may not be connected to the driving voltage line 172 in the other pixel. That is, as shown in FIG. 3 and FIG. 10, the eighth connection electrode CE8 may be connected to the driving voltage line 172 only at one side based on a center of the eighth connection electrode CE8.

In this case, in a pixel to which the driving voltage line 172 and the eighth connection electrode CE8 are not connected, the vertical portion 128b of the second initialization voltage line 128 may be disposed in the second direction DR2.

Referring to FIG. 11, the eighth connection electrode CE8 includes a stem portion CE8_L disposed along the second direction DR2 and an extension portion CE8_W extending from the stem portion in the first direction DR1. In the stem portion CE8_L, the eighth connection electrode CE8 may be connected to the polycrystalline semiconductor layer ACT1 through an (8-1)-th opening OP8_1, and may be connected to the first storage electrode 1153 through an (8-2)-th opening OP8_2.

Although described later in FIG. 12, the ELVDD voltage may be supplied by being connected to the driving voltage line 172 through the driving opening OP_172 in the extension portion CE8_W of the eighth connection electrode CE8.

Referring to FIG. 11, the extension portion CE8_W of the eighth connection electrode CE8 is disposed only at one side based on the stem portion CE8_L. The vertical portion 128b of the second initialization voltage line 128 may be disposed in an area in which the extension portion CE8_W of the eighth connection electrode CE8 is not disposed.

Now, referring to FIG. 4, FIG. 5, and FIG. 11 simultaneously, a third interlayer insulating film 180 may be disposed on the first data conductive layer DE1.

A second data conductive layer DE2 may be disposed on the third interlayer insulating film 180. FIG. 12 illustrates the polycrystalline semiconductor layer ACT1, the first gate conductive layer GE1, the second gate conductive layer GE2, the oxide semiconductor layer ACT2, the third gate conductive layer GE3, the first data conductive layer DE1, and the second data conductive layer DE2 together.

The second data conductive layer DE2 may include the data line 171, the driving voltage line 172, and a connection pattern 177. The data line 171 and the driving voltage line 172 may be disposed along the second direction DR2.

The data line 171 may be connected to the second connection electrode CE2 through a data opening OP_171. Since the second connection electrode CE2 is connected to the polycrystalline semiconductor layer ACT1 through the (2-1)-th opening OP2_1, a data voltage of the data line 171 is transmitted to the polycrystalline semiconductor layer ACT1. Specifically, the data line 171 may be connected to the first electrode of the second transistor T2.

The driving voltage line 172 may be disposed along the second direction DR2, and may be connected to the eighth connection electrode CE8 in the driving opening OP_172. Specifically, it may be connected to the extension portion CE8_W of the eighth connection electrode CE8.

Figure 12:
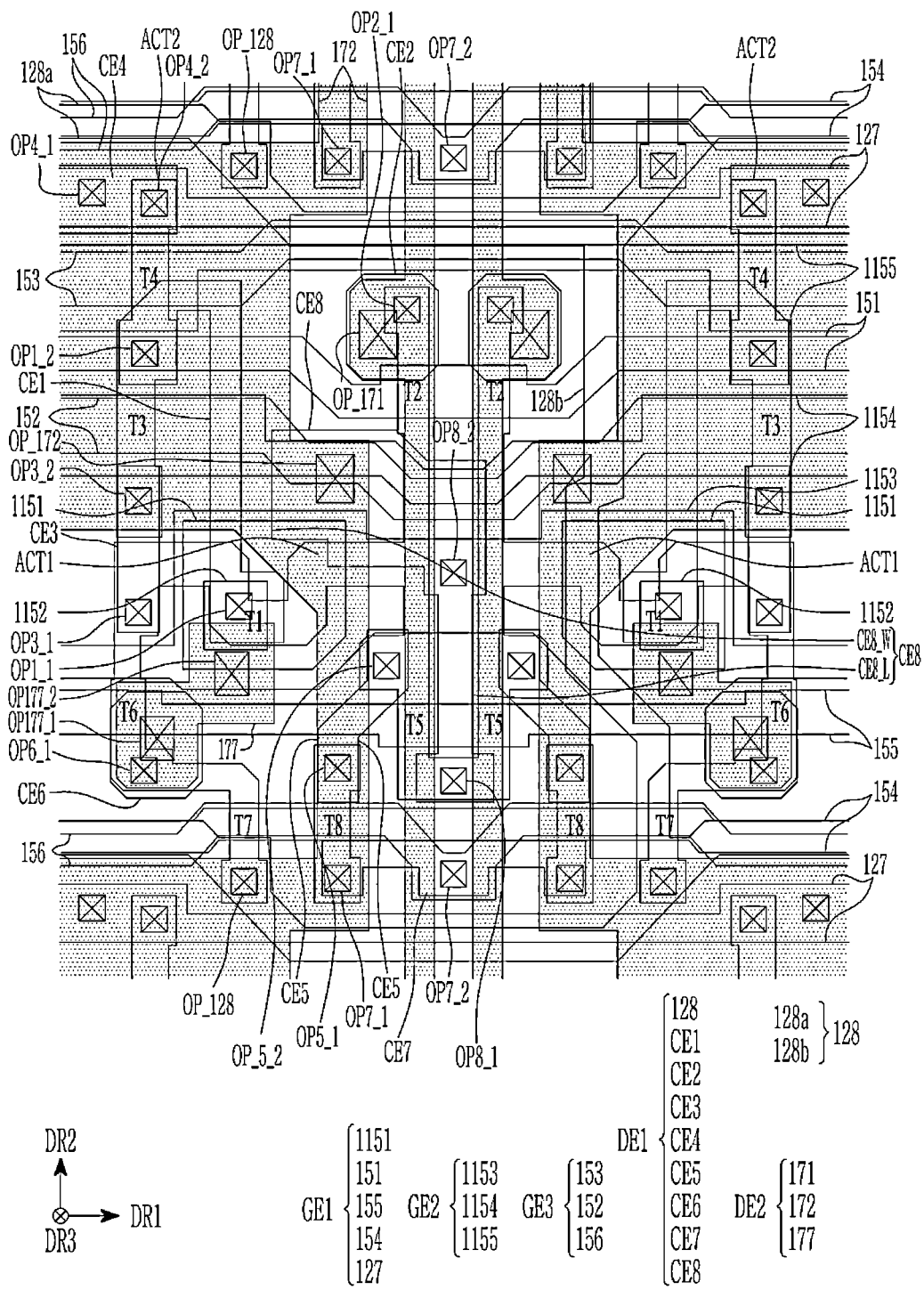

Referring to FIG. 4, FIG. 5, and FIG. 12 Still referring, since the driving voltage line 172 is connected to the eighth connection electrode CE8 in the driving opening OP_172 and the eighth connection electrode CE8 is connected to the first storage electrode 1153 through the (8-2)-th opening OP8_2, the driving voltage line 172 is connected to the first storage electrode 1153.

The connection pattern 177 may be connected to the sixth connection electrode CE6 through a first connection opening OP_177_1, and may be connected to an anode electrode (not shown) through a second connection opening OP_177_2.

Although not illustrated, a passivation film may be disposed on the second data conductive layer DE2 including the data line 171 and the driving voltage line 172, and the anode electrode may be disposed on the passivation film. The anode electrode may be connected to the sixth transistor T6, and may receive an output current of the driving transistor T1. A partition wall may be disposed on the anode electrode. An opening is formed in the partition wall, and the opening of the partition wall may overlap the anode electrode. A light emitting element layer may be disposed in the opening of the partition wall. A cathode electrode may be disposed on the light emitting element layer and the partition wall. The anode electrode, the light emitting element layer, and the cathode electrode may form a light emitting diode LED.

As described above, in the display device according to the embodiment, since the second initialization voltage line 128 is disposed in a mesh shape including the horizontal portion 128a and the vertical portion 128b, it is possible to solve the problem that the load of the second initialization voltage VINT2 varies for each area.

Referring to FIG. 1, the vertical portion 128b of the second initialization voltage line 128 is disposed only in some of several adjacent pixels. FIG. 1 illustrates a configuration in which one vertical portion 128b of the second initialization voltage line 128 is disposed per four pixels PX.

Figure 13:
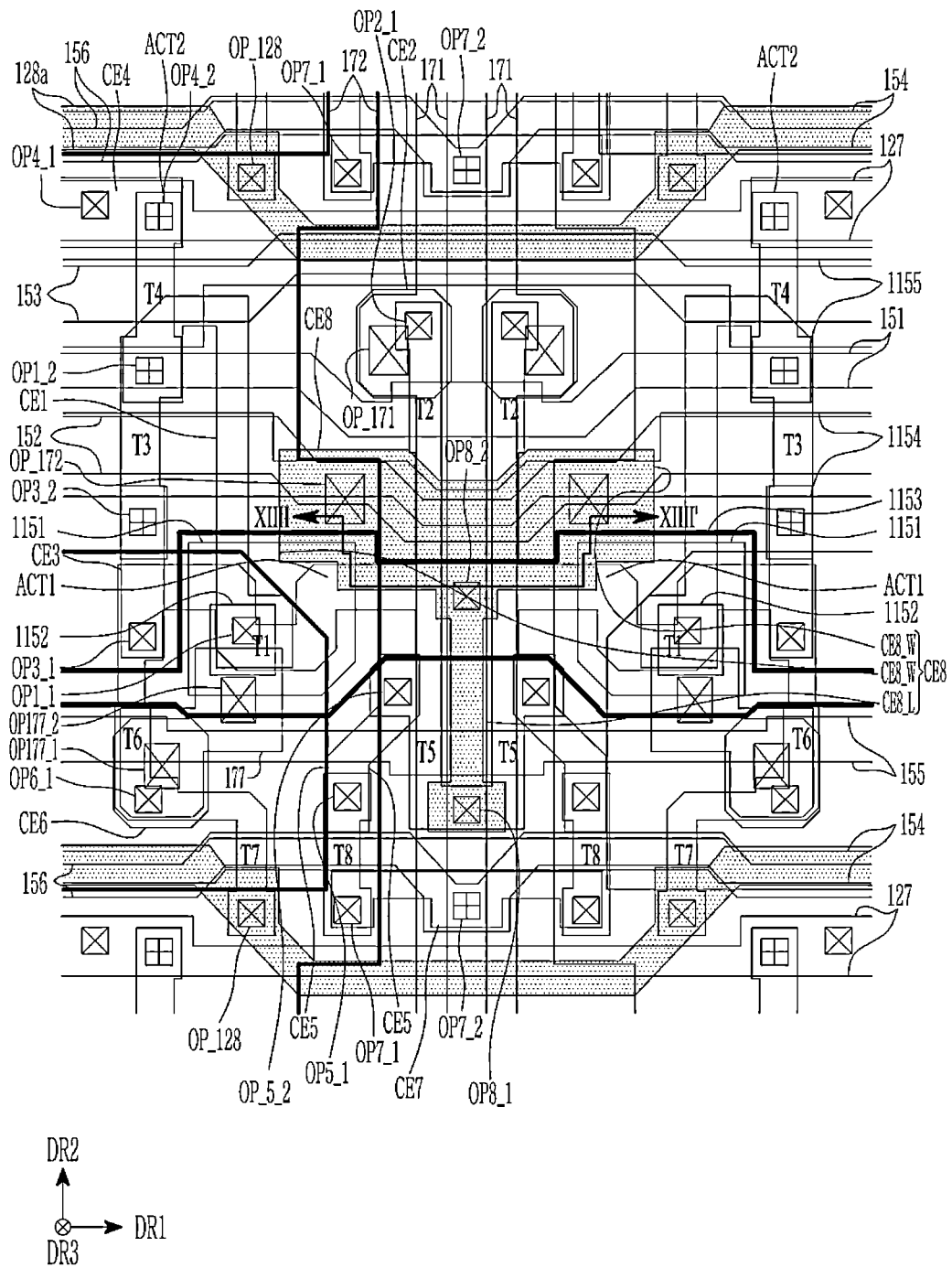
FIG. 13 illustrates a top plan view of an area in which a vertical portion of a second initialization voltage line is not disposed.
Figure 14:
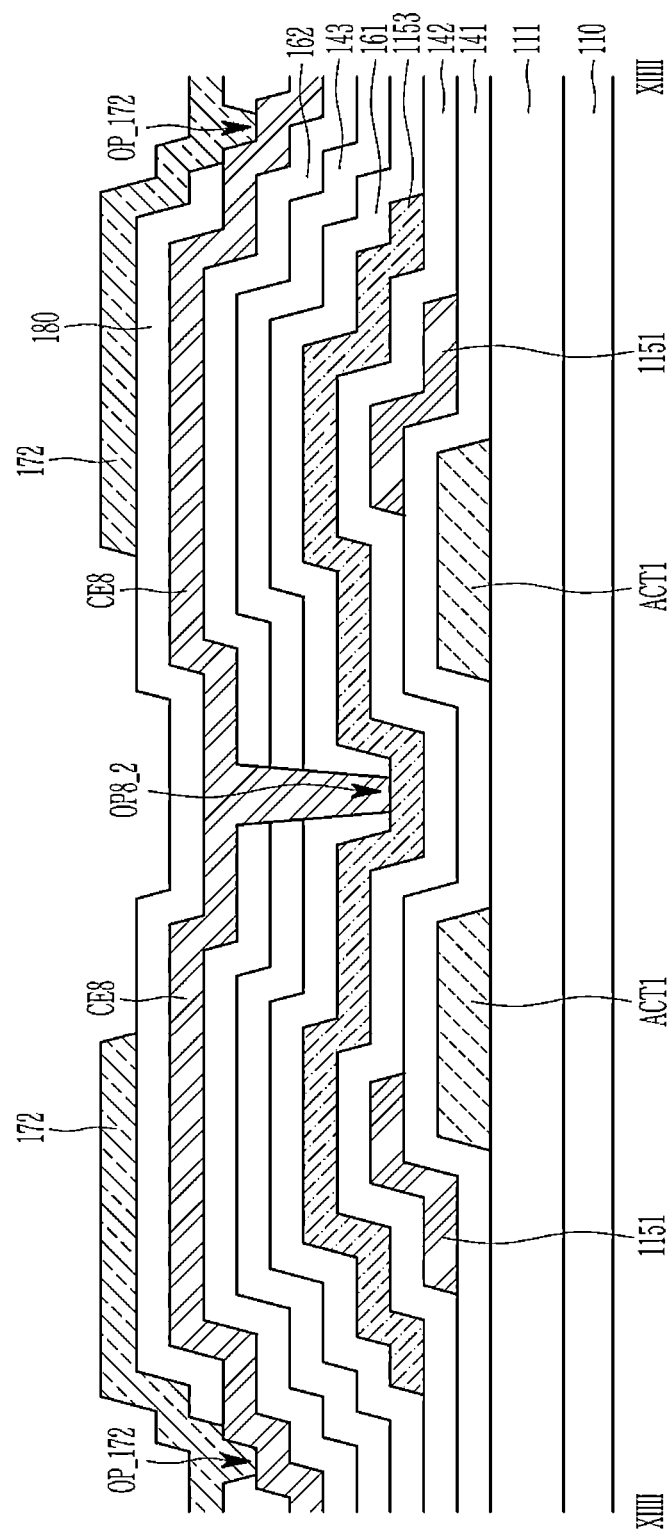
FIG. 14 illustrates a cross-sectional view taken along line XIV-XIV' of FIG. 13.

FIGS. 3, 4, 5, 6, 7, 8, 9, 10, 11, and 12 illustrate layout views of the area in which the vertical portion 128b of the second initialization voltage line 128 is disposed. That is, FIG. 3 illustrates an area indicated by "A" in FIG. 1. FIG. 13 illustrates an area in which the vertical portion 128b of the second initialization voltage line 128 is not disposed, that is, FIG. 13 illustrates an area indicated by "B" in FIG. 1. FIG. 14 illustrates a cross-sectional view taken along line XIV-XIV' of FIG. 13.

Comparing FIG. 3 and FIG. 13, in the case of the area shown in FIG. 13, the eighth connection electrode CE8 includes the stem portion CE8_L and the extension portion CE8_W at each side of the stem portion, and it is connected to the driving voltage line 172 through two driving openings OP_172 disposed at respective sides through the expansion portion CE8_W. In addition, it is the same as that of FIG. 3 except that the vertical portion 128b of the second initialization voltage line 128 is not disposed. A detailed description of the same constituent elements will be omitted.

The eighth connection electrode CE8 of FIG. 3 includes the extension portion CE8_W only at one side based on the stem portion CE8_L, and is connected to the driving voltage line 172 only in one of two adjacent pixels, while in the case of FIG. 12, the eighth connection electrode CE8 includes the extension portion CE8_W at respective sides of the stem portion CE8_L, and is connected to the driving voltage line 172 in both of two adjacent pixels.

Figure 15:
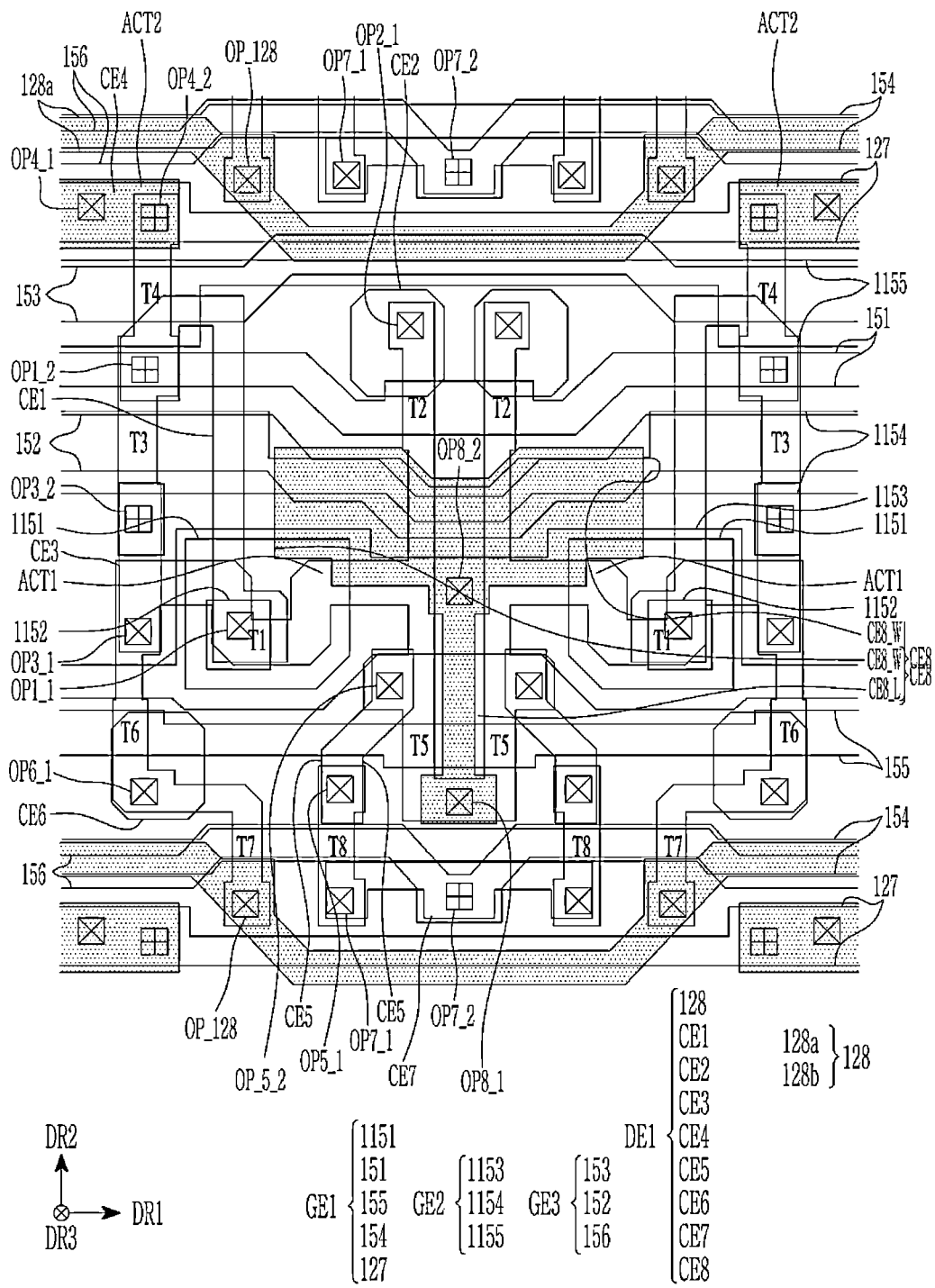
FIG. 15 illustrates the same layout as that of FIG. 11 with respect to the area indicated in FIG. 13.

FIG. 15 illustrates the same layout as that of FIG. 11 with respect to the area indicated in FIG. 13. Comparing FIG. 11 and FIG. 15, in FIG. 15, the eighth connection electrode CE8 includes the stem portion CE8_L disposed along the second direction DR2 and the extension portion CE8_W extending from each side of the stem portion in the first direction DR1.

That is, in FIG. 11, in the eighth connection electrode CE8, the extension portion CE8_W is disposed only at one side of the stem portion CE8_L, and a vertical portion 128b of the second initialization voltage line 128 is disposed at one side at which the extension portion CE8_W is not disposed. However, in the case of FIG. 15, the extension portions CE8_W are disposed at each side of the stem portion CE8_L of the eighth connection electrode CE8. One extension portion CE8_W may be connected to the driving voltage line 172, and another extension portion CE8_W may be connected to another driving voltage line 172.

Figure 16:
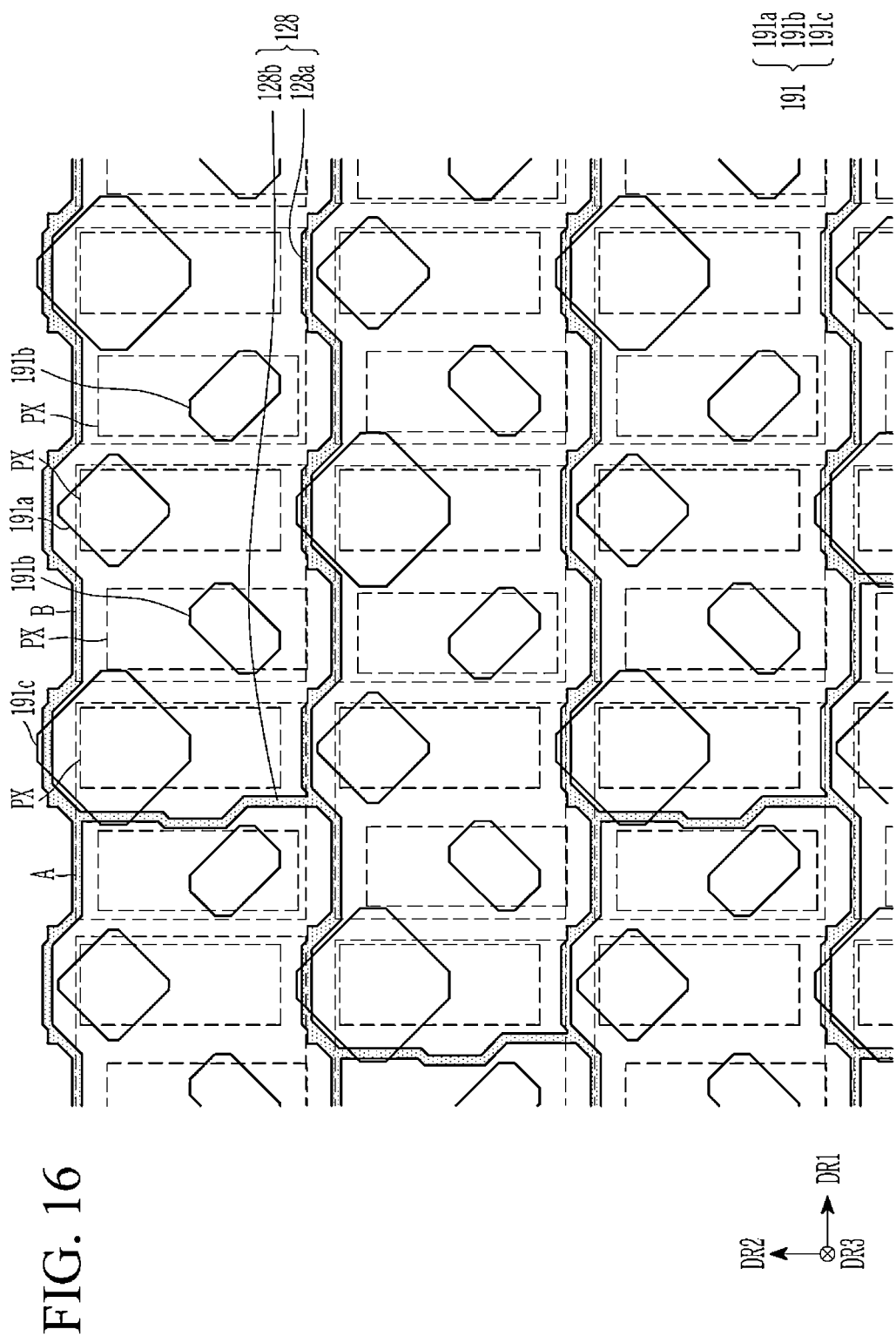
FIG. 16 illustrates the same area as that of FIG. 1 with respect to another embodiment.

FIG. 16 illustrates the same area as that of FIG. 1 with respect to another embodiment. Referring to FIG. 16, the display device according to the embodiment of FIG. 16 is the same as that of the embodiment of FIG. 1 except that one vertical portion 128b of the second initialization voltage line 128 is disposed per eight adjacent pixels PX in the first direction DR1. A detailed description of the same constituent elements will be omitted.

As shown in FIG. 16, even if one vertical portion 128b of the second initialization voltage line 128 is disposed per eight neighboring pixels, the same effect as that of FIG. 1 may be obtained.

Figure 17:
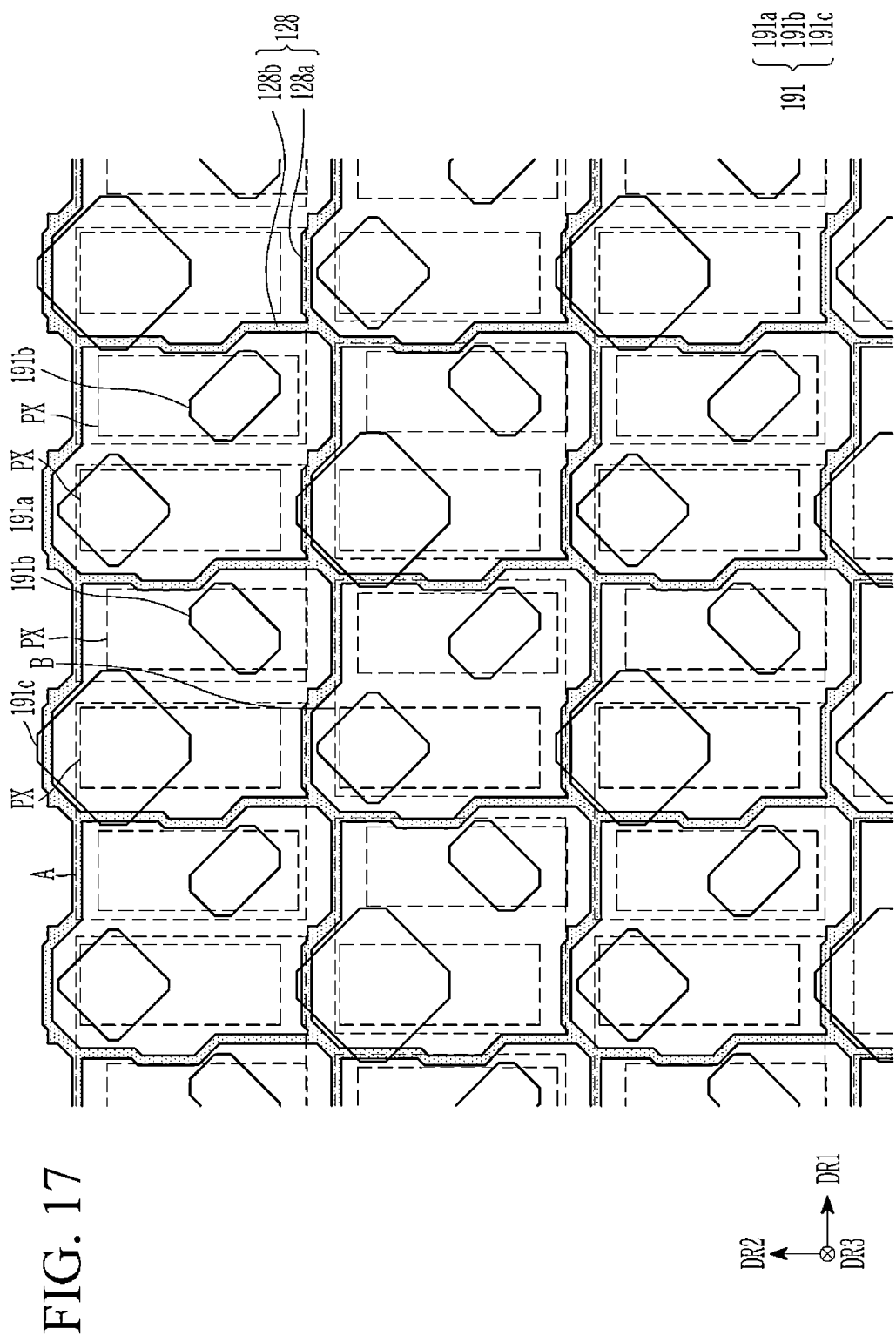
FIG. 17 illustrates the same area as that of FIG. 1 with respect to another embodiment.

FIG. 17 illustrates the same area as that of FIG. 1 with respect to another embodiment. Referring to FIG. 17, the display device according to the embodiment of FIG. 17 is the same as that of the embodiment of FIG. 1, except that one vertical portion 128b of the second initialization voltage line 128 is disposed per two adjacent pixels PX in the first direction DR1. A detailed description of the same constituent elements will be omitted.

As shown in FIG. 17, even though there is one vertical portion 128b of the second initialization voltage line 128 per every two neighboring pixels, the same effect as that of FIG. 1 may be obtained.

FIG. 1 illustrates the configuration in which one vertical portion 128b of the second initialization voltage line 128 is disposed per every four adjacent pixels, FIG. 16 illustrates the configuration in which one vertical portion 128b of the second initialization voltage line 128 is disposed per every eight adjacent pixels, and FIG. 17 illustrates the configuration in which one vertical portion 128b of the second initialization voltage line 128 is disposed per every two adjacent pixels, but the present disclosure is not limited thereto.

That is, in the embodiment, one vertical portion 128b of the second initialization voltage line 128 may be disposed per n adjacent pixels. In this case, n may be 1 to 50.

As described above, in some pixels of the display device according to the embodiment, the area of the eighth storage electrode CE8 for transmitting the driving voltage ELVDD in the first direction DR1 is reduced, and the vertical portion 128b of the initialization voltage line 128 is disposed in the second direction DR2 in the corresponding area, thus the second initialization voltage line 128 is formed in a mesh shape. Accordingly, the same second initialization voltage VINT2 is evenly transmitted for each area of the display device, thereby preventing a pinkish display image due to a load difference between the second initialization voltages VINT2 for respective areas.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:
1. A display device comprising:
a substrate;
a plurality of pixels disposed on the substrate;
a first initialization voltage line disposed on the substrate and extending along a first direction;
a second initialization voltage line disposed on a different layer from the first initialization voltage line;
a connection electrode disposed on a same layer as the second initialization voltage line; and
a driving voltage line disposed on the second initialization voltage line and the connection electrode along the second direction,
wherein the second initialization voltage line includes horizontal portions extending along the first direction, and vertical portions extending along a second direction crossing the first direction,
the horizontal portions and the vertical portions form a plurality of opening areas each of which is completely surrounded by adjacent horizontal portions and adjacent vertical portions,
the first initialization voltage line is disposed closer to the substrate than the second initialization voltage line,
the connection electrode includes a stem portion parallel to the second direction and an extension portion extending from the stem portion in the first direction,
the extension portion of the connection electrode is not disposed in one of the plurality of pixels in which the vertical portions of the second initialization voltage line is disposed, and
each of the plurality of opening areas overlaps with at least two pixels.
2. The display device of claim 1, wherein one vertical portion is disposed along the first direction for every two pixels.
3. The display device of claim 1, wherein the connection electrode is connected to the driving voltage line in the extension portion of the connection electrode.
4. The display device of claim 1,
wherein, among pixels which are disposed adjacent each other in the first direction, one of the plurality of pixels in which the vertical portions of the second initialization voltage line is not disposed between the pixels includes extension portions being disposed at each side of the stem portion of the connection electrode, and
each of the extension portions is connected to the driving voltage line in two pixels adjacent to each other in the first direction.
5. The display device of claim 1, further comprising:
a polycrystalline semiconductor layer disposed between the substrate and the first initialization voltage line.
6. The display device of claim 5,
wherein a portion of the polycrystalline semiconductor layer overlaps the connection electrode and the second initialization voltage line in a third direction perpendicular to a surface of the substrate.

7. The display device of claim 5, further comprising:
an oxide semiconductor layer disposed between the polycrystalline semiconductor layer and the second initialization voltage line.

8. The display device of claim 7,
wherein the oxide semiconductor layer is disposed along the second direction, and
the oxide semiconductor layer does not overlap the polycrystalline semiconductor layer in a third direction perpendicular to the surface of the substrate.

9. The display device of claim 7,
wherein the oxide semiconductor layer does not overlap the connection electrode and the second initialization voltage line in a third direction perpendicular to the surface of the substrate.

10. A display device comprising:
a substrate;
a first semiconductor layer disposed on the substrate;
a first initialization voltage line extending along a first direction and disposed on the first semiconductor layer;
a second semiconductor layer disposed on the first initialization voltage line and extending along a second direction crossing the first direction;
a second initialization voltage line and a connection electrode disposed on the second semiconductor layer; and
a driving voltage line disposed on the second initialization voltage line and the connection electrode, and extending along the second direction,
wherein the second initialization voltage line includes horizontal portions extending along the first direction and vertical portions extending along the second direction,
the horizontal portions and the vertical portions form a plurality of opening areas each of which is completely surrounded by adjacent horizontal portions and adjacent vertical portions, and
the first initialization voltage line is disposed closer to the substrate than the second initialization voltage line,
the connection electrode includes a stem portion parallel to the second direction and an extension portion extending from the stem portion in the first direction,
the connection electrode is connected to the driving voltage line in the extension portion,
the extension portion of the connection electrode is not disposed in one of the plurality of pixels in which the vertical portions of the second initialization voltage line is disposed, and
each of the plurality of opening areas overlaps with at least two pixels.

11. The display device of claim 10,
wherein the stem portion of the connection electrode is disposed between the extension portion of the connection electrode and the vertical portions of the second initialization voltage line.

12. The display device of claim 10,
wherein the first semiconductor layer is a polycrystalline semiconductor layer and the second semiconductor layer is an oxide semiconductor layer, and
the first semiconductor layer and the second semiconductor layer do not overlap each other in a third direction perpendicular to a surface of the substrate.

13. The display device of claim 12, further comprising:
a gate electrode, a first scan line, a light emission control line, and a bypass control line disposed on a same layer as the first initialization voltage line along the first direction,
wherein the polycrystalline semiconductor layer overlapping the gate electrode in the third direction perpendicular to the surface of the substrate forms a driving transistor.

14. The display device of claim 13,
wherein an area of the polycrystalline semiconductor layer overlapping the first scan line in the third direction perpendicular to the surface of the substrate forms a second transistor,
an area of the polycrystalline semiconductor layer overlapping the light emission control line in the third direction perpendicular to the surface of the substrate forms a fifth transistor and a sixth transistor, and
an area of the polycrystalline semiconductor layer overlapping the bypass control line in the third direction perpendicular to the surface of the substrate forms a seventh transistor and an eighth transistor.

15. The display device of claim 12, further comprising:
an initialization control line and a second scan line disposed along the first direction between the oxide semiconductor layer and the second initialization voltage line,
wherein an area of the oxide semiconductor layer overlapping the second scan line in the third direction perpendicular to the surface of the substrate forms a third transistor, and
an area of the oxide semiconductor layer overlapping the initialization control line in the third direction perpendicular to the surface of the substrate forms a fourth transistor.

* * * * *